US010177566B2

(12) United States Patent
Zhao et al.

(10) Patent No.: US 10,177,566 B2
(45) Date of Patent: Jan. 8, 2019

(54) APPARATUS AND METHODS FOR ACTIVELY-CONTROLLED TRIGGER AND LATCH RELEASE THYRISTOR

(71) Applicant: ANALOG DEVICES, INC., Norwood, MA (US)

(72) Inventors: James Zhao, San Francisco, CA (US); Javier Alejandro Salcedo, North Billerica, MA (US); Srivatsan Parthasarathy, Acton, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 385 days.

(21) Appl. No.: 15/188,626

(22) Filed: Jun. 21, 2016

(65) Prior Publication Data
US 2017/0366002 A1  Dec. 21, 2017

(51) Int. Cl.
*H02H 9/04* (2006.01)
*H01L 27/02* (2006.01)

(52) U.S. Cl.
CPC .......... *H02H 9/046* (2013.01); *H01L 27/0262* (2013.01); *H02H 9/044* (2013.01);
(Continued)

(58) Field of Classification Search
USPC .......................................... 361/56, 91.1, 111
See application file for complete search history.

(56) References Cited

U.S. PATENT DOCUMENTS 5,719,733 A  2/1998 Wei et al.
5,748,425 A  5/1998 Gutsch et al.
(Continued)

FOREIGN PATENT DOCUMENTS

CN   201536104 U   7/2010
CN   102118024 A   7/2011
(Continued)

OTHER PUBLICATIONS

Salcedo et al., Monolithic ESD Protection for Distributed High Speed Applications in 28-nm CMOS Technology, IEEE 2014, 4 pages.
(Continued)

*Primary Examiner* — Danny Nguyen
(74) *Attorney, Agent, or Firm* — Knobbe Martens Olson & Bear LLP

(57) ABSTRACT

Apparatus and methods for actively-controlled trigger and latch release thyristor are provided. In certain configurations, an actively-controlled protection circuit includes an overvoltage sense circuit, a thyristor or silicon controlled rectifier (SCR) that is electrically connected between a signal node and a discharge node, and an active trigger and latch release circuit. The overvoltage sense circuit controls a voltage of a dummy supply node based on a voltage of the signal node, and the active trigger and latch release circuit detects presence of a transient overstress event at the signal node based on the voltage of the dummy supply node. The active trigger and latch release circuit provides one or more trigger signals to the SCR to control the SCR's activation voltage, and the active trigger and latch release circuit activates or deactivates the one or more trigger signals based on whether or not the transient overstress event is detected.

20 Claims, 21 Drawing Sheets

(52) U.S. Cl.
CPC .............. *H01L 2224/48091* (2013.01); *H01L 2224/48145* (2013.01); *H01L 2224/48247* (2013.01); *H01L 2924/181* (2013.01)

(56) References Cited

U.S. PATENT DOCUMENTS

| | | | |
|---|---|---|---|
| 5,835,328 | A | 11/1998 | Maloney et al. |
| 5,870,268 | A | 2/1999 | Lin et al. |
| 5,973,341 | A | 10/1999 | Letavic et al. |
| 6,429,489 | B1 | 8/2002 | Botula et al. |
| 6,442,008 | B1 | 8/2002 | Anderson |
| 6,614,633 | B1 | 9/2003 | Kohno |
| 7,064,393 | B2 | 6/2006 | Mergens et al. |
| 7,102,862 | B1 | 9/2006 | Lien et al. |
| 7,106,563 | B2 * | 9/2006 | Lai .................. H01L 27/0251 361/111 |
| 7,285,828 | B2 | 10/2007 | Salcedo et al. |
| 7,566,914 | B2 | 7/2009 | Salcedo et al. |
| 7,601,991 | B2 | 10/2009 | Salcedo et al. |
| 7,706,113 | B1 | 4/2010 | Lien et al. |
| 7,738,222 | B2 | 6/2010 | Deutschmann et al. |
| 8,044,457 | B2 | 10/2011 | Salcedo et al. |
| 8,222,698 | B2 | 7/2012 | Salcedo et al. |
| 8,320,091 | B2 | 11/2012 | Salcedo et al. |
| 8,345,394 | B2 | 1/2013 | Zhao et al. |
| 8,368,116 | B2 | 2/2013 | Salcedo et al. |
| 8,416,543 | B2 | 4/2013 | Salcedo |
| 8,422,187 | B2 | 4/2013 | Parthasarathy et al. |
| 8,432,651 | B2 | 4/2013 | Salcedo et al. |
| 8,462,477 | B2 | 6/2013 | Modica et al. |
| 8,466,489 | B2 | 6/2013 | Salcedo et al. |
| 8,553,380 | B2 | 10/2013 | Salcedo |
| 8,564,065 | B2 | 10/2013 | Donovan et al. |
| 8,582,261 | B2 | 11/2013 | Salcedo et al. |
| 8,592,860 | B2 | 11/2013 | Salcedo et al. |
| 8,610,251 | B1 | 12/2013 | Salcedo |
| 8,637,899 | B2 | 1/2014 | Salcedo |
| 8,649,134 | B2 | 2/2014 | Smith |
| 8,665,571 | B2 | 3/2014 | Salcedo et al. |
| 8,680,620 | B2 | 3/2014 | Salcedo et al. |
| 8,723,227 | B2 | 5/2014 | Salcedo et al. |
| 8,730,630 | B2 | 5/2014 | Parthasarathy et al. |
| 8,773,826 | B2 | 7/2014 | Althlaguirre et al. |
| 8,796,729 | B2 | 8/2014 | Clarke et al. |
| 8,860,080 | B2 | 10/2014 | Salcedo |
| 8,946,822 | B2 | 2/2015 | Salcedo et al. |
| 8,947,841 | B2 | 2/2015 | Salcedo et al. |
| 8,958,187 | B2 | 2/2015 | Parthasarathy et al. |
| 9,006,781 | B2 | 4/2015 | Salcedo et al. |
| 9,088,256 | B2 | 7/2015 | Cosgrave et al. |
| 9,123,540 | B2 | 9/2015 | Salcedo et al. |
| 9,147,677 | B2 | 9/2015 | Salcedo et al. |
| 9,171,832 | B2 | 10/2015 | Salcedo et al. |
| 9,184,098 | B2 | 11/2015 | Salcedo et al. |
| 9,275,991 | B2 | 3/2016 | Salcedo et al. |
| 9,293,912 | B2 | 3/2016 | Parthasarathy et al. |
| 9,478,608 | B2 | 10/2016 | Salcedo et al. |
| 9,634,482 | B2 | 4/2017 | Parthasarathy et al. |
| 2002/0153571 | A1 | 10/2002 | Mergens et al. |
| 2004/0114288 | A1 | 6/2004 | Cheng et al. |
| 2006/0103998 | A1 | 5/2006 | Smith |
| 2007/0076338 | A1 | 4/2007 | Traynor et al. |
| 2008/0106837 | A1 | 5/2008 | Jang |
| 2008/0247102 | A1 | 10/2008 | Vinson |
| 2008/0304191 | A1 | 12/2008 | Riviere et al. |
| 2008/0316659 | A1 | 12/2008 | Oguzman et al. |
| 2010/0148797 | A1 | 6/2010 | Ker et al. |
| 2010/0149701 | A1 | 6/2010 | Drapkin et al. |
| 2010/0214706 | A1 | 8/2010 | Crespo et al. |
| 2010/0328827 | A1 | 12/2010 | Lai et al. |
| 2011/0222196 | A1 | 9/2011 | Smith |
| 2011/0235228 | A1 | 9/2011 | Salcedo et al. |
| 2012/0002337 | A1 | 1/2012 | Parthasarathy et al. |
| 2012/0057260 | A1 | 3/2012 | Poulton |
| 2012/0180008 | A1 | 7/2012 | Gist et al. |
| 2012/0257317 | A1 * | 10/2012 | Abou-Khalil ....... H01L 27/0262 361/56 |
| 2013/0155558 | A1 | 6/2013 | Bourgeat et al. |
| 2014/0078624 | A1 | 3/2014 | Nagamatsu et al. |
| 2014/0133055 | A1 | 5/2014 | Parthasarathy et al. |
| 2014/0185168 | A1 | 7/2014 | Kunz, Jr. et al. |
| 2014/0355157 | A1 | 12/2014 | Huang et al. |
| 2016/0020603 | A1 | 1/2016 | Parthasarathy et al. |
| 2016/0087429 | A1 | 3/2016 | Wang et al. |
| 2016/0204096 | A1 | 7/2016 | Zhao et al. |
| 2016/0261110 | A1 | 9/2016 | Ivanov et al. |
| 2016/0285255 | A1 | 9/2016 | O'Donnell et al. |
| 2016/0300830 | A1 | 10/2016 | Salcedo et al. |
| 2016/0336740 | A1 | 11/2016 | Parthasarathy et al. |
| 2016/0336744 | A1 | 11/2016 | Parthasarathy et al. |
| 2017/0243862 | A1 | 8/2017 | Parthasarathy et al. |
| 2017/0256534 | A1 | 9/2017 | Parthasarathy et al. |
| 2017/0317070 | A1 | 11/2017 | Salcedo et al. |
| 2018/0026440 | A1 | 1/2018 | Zhao et al. |
| 2018/0158814 | A1 | 6/2018 | Salcedo et al. |
| 2018/0211951 | A1 | 7/2018 | Luo et al. |
| 2018/0226788 | A1 | 8/2018 | Salcedo et al. |

FOREIGN PATENT DOCUMENTS

| | | |
|---|---|---|
| CN | 103217720 A | 7/2013 |
| CN | 103248033 A | 8/2013 |
| CN | 103915828 A | 7/2014 |
| EP | 1617477 A1 | 1/2006 |
| EP | 1048078 B1 | 5/2010 |
| TW | 577166 B | 2/2004 |
| WO | WO 2009/050641 | 4/2009 |
| WO | WO 2014/180184 A1 | 11/2014 |

OTHER PUBLICATIONS

Salcedo et al., Electrostatic Discharge Protection Framework for Mixed-Signal High Voltage CMOS Applications. 9th International Conference on Solid-State and Integrated-Circuit Technology, Oct. 2008. 4 pages.

* cited by examiner

APPARATUS AND METHODS FOR ACTIVELY-CONTROLLED TRIGGER AND LATCH RELEASE THYRISTOR

BACKGROUND

Field

Embodiments of the invention relate to electronic systems, and more particularly, to actively-controlled thyristor protection devices.

Description of the Related Technology

Certain electronic systems can be exposed to transient overstress events, or electrical signals of short duration having rapidly changing voltage and high power. Transient overstress events can include, for example, electrical overstress (EOS) events and/or electrostatic discharge (ESD) events arising from the abrupt release of charge from an object or person to an electronic system.

Transient overstress events can damage or destroy integrated circuits (ICs) by generating overvoltage conditions and high levels of power dissipation in relatively small areas of the ICs. High power dissipation can increase IC temperature, and can lead to numerous problems, such as gate oxide punch-through, junction damage, metal damage, and surface charge accumulation.

SUMMARY

In one aspect, an integrated circuit is provided. The integrated circuit includes a silicon controlled rectifier (SCR) electrically connected between a signal node and a discharge node, and the SCR is configured to receive one or more trigger signals that are operable to control an activation voltage of the SCR. The integrated circuit further includes an overvoltage sense circuit configured to control a voltage of a dummy supply node based on a voltage of the signal node. The integrated circuit further includes an active trigger and latch release circuit configured to detect presence of a transient overstress event at the signal node based on the voltage of the dummy supply node and to control activation and latch release of the SCR. The active trigger and latch release circuit is further configured to activate the one or more trigger signals in response to detecting presence of the transient overstress event.

In another aspect, a method for protecting an integrated circuit from electrical overstress is provided. The method includes controlling a voltage of a dummy supply node based on a voltage of a signal node using an overvoltage sense circuit, detecting a presence of a transient overstress event at the signal node based on the voltage of the dummy supply node using an active trigger and latch release circuit, activating one or more trigger signals in response to detecting the presence of the transient overstress event using the active trigger and latch release circuit, and controlling an activation voltage of an SCR that is electrically connected between the signal node and a discharge node based on the one or more trigger signals.

In another aspect, a packaged system includes a lead and a first system on a chip (SOC) electrically connected to the lead. The first SOC includes an SCR electrically connected between a signal node and a discharge node, and the SCR is configured to receive one or more trigger signals that are operable to control an activation voltage of the SCR. The first SOC further includes an overvoltage sense circuit configured to control a voltage of a dummy supply node based on a voltage of the signal node. The first SOC further includes an active trigger and latch release circuit configured to detect presence of a transient overstress event at the signal node based on a voltage difference between the dummy supply node and the discharge node. The active trigger and latch release circuit is further configured to activate the one or more trigger signals in response to detecting presence of the transient overstress event.

DETAILED DESCRIPTION OF EMBODIMENTS

Figure 1A:
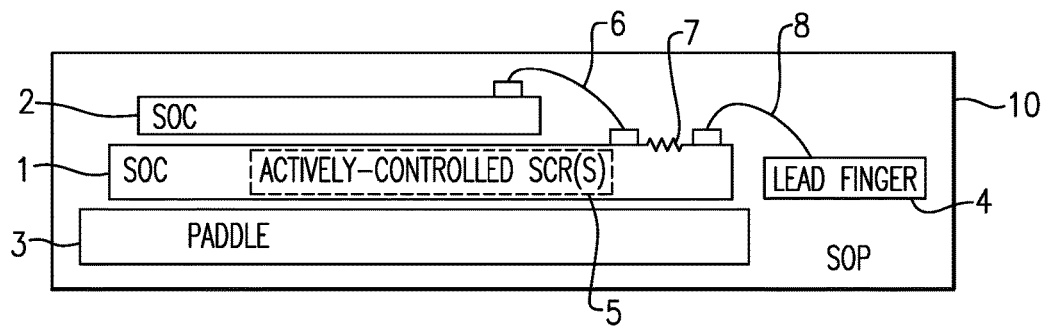
FIG. 1A is a schematic diagram of a cross-section of a system on package (SOP) according to one embodiment.

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Certain electronic systems include overstress protection circuits to protect circuits or components from transient overstress events. To help guarantee that an electronic system is reliable, manufacturers can test the electronic system under defined stress conditions, which can be described by standards set by various organizations, such as the Joint Electronic Device Engineering Council (JEDEC), the International Electrotechnical Commission (IEC), and the Automotive Engineering Council (AEC). The standards can cover a wide multitude of transient overstress events, including electrical overstress (EOS) and/or electrostatic discharge (ESD) events.

An actively-controlled protection circuit is a type of overstress protection circuit that detects for the presence of a transient overstress event by monitoring for electrical conditions associated with overstress. By implementing a protection circuit to be actively controlled, relatively fast activation times, relatively low static power dissipation, and/or relatively compact area can be achieved relative to an implementation that relies on native junction breakdown to provide clamping.

In certain configurations herein, an actively-controlled protection circuit includes an overvoltage sense circuit, a silicon controlled rectifier (SCR) that is electrically connected between a signal node and a discharge node, and an active trigger and latch release circuit. The overvoltage sense circuit controls a voltage of a dummy supply node based on a voltage of the signal node, and the active trigger and latch release circuit detects presence of a transient overstress event at the signal node based on the voltage of the dummy supply node. The active trigger and latch release circuit provides one or more trigger signals to the SCR to control the SCR's activation voltage, and the active trigger and latch release circuit activates or deactivates the one or more trigger signals based on whether or not the transient overstress event is detected. For example, the active trigger and latch release circuit can activate the one or more trigger signals in response to detecting the transient overstress event to lower the SCR's activation voltage, and subsequently deactivate the one or more trigger signals after passage of the transient overstress event to control latch release of the SCR.

The SCR, which is also referred to herein as a thyristor, can be implemented via a scalable layout to aid in providing an amount of overstress protection desired for a particular application and/or implementation. For example, the SCR can have a layout implemented with a unit area that can be scaled to provide custom protection and/or loading control.

The SCR includes an NPN bipolar transistor and a PNP bipolar transistor that are cross-coupled with one another. In certain implementations, the one or more trigger signals include at least one of a voltage signal provided to a base the NPN bipolar transistor or a current provided to a base of the PNP bipolar transistor. Thus, control over the SCR's latching/triggering and latch release can be realized via trigger signals that provide local control at the base(s) of the SCR's embedded bipolar transistors. By implemented an actively-controlled SCR in this manner, both fast activation time and high current handling capability per unit area can be achieved. In certain implementations, an actively-controlled SCR can turn on during overstress conditions to provide transient overstress protection at a voltage below normal circuit operating voltage levels.

In contrast, an SCR that relies on native junction breakdown may have not have a sufficiently fast activation time, and thus circuitry protected by such an SCR can be exposed to voltage overshoot that may lead to damage. Moreover an SCR that triggers via direct junction breakdown can be implemented with an activation voltage that has a sufficiently high voltage margin to reduce the likelihood that the SCR is inadvertent triggered in the presence of normal circuit operating voltage levels. Although implementing the SCR with activation voltage margin can reduce or eliminate false triggering, the activation voltage margin can further degrade the SCR's turn-on speed.

Accordingly, activation time of SCR-based protection circuits remains a challenge to providing suitable protection for applications protecting devices with relatively low breakdown voltages, including, for instance, devices fabricated using advanced complementary metal oxide semiconductor (CMOS) technologies, bipolar complementary metal oxide semiconductor (BiCMOS) technologies, and/or compound semiconductor technologies.

Figure 1B:
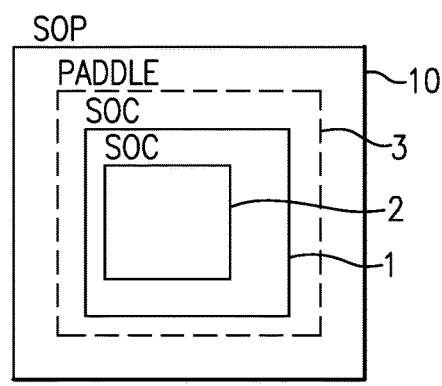
FIG. 1B is a schematic diagram of a plan view of the SOP of FIG. 1A.

FIG. 1A is a schematic diagram of a cross-section of a system on package (SOP) 10 according to one embodiment. FIG. 1B is a schematic diagram of a plan view of the SOP 10 of FIG. 1A. The SOP 10 includes a first system on a chip (SOC) 1, a second SOC 2, a paddle 3, a lead finger 4, a first wirebond 6, and a second wirebond 8. The first SOC 1 includes actively-controlled SCR(s) 5 and an on-chip passive circuit 7, which is implemented using a resistor in this embodiment.

Although FIG. 1A illustrates a specific embodiment of a SOP, the teachings herein are applicable to SOPs implemented using a wide variety of configurations. For example, a SOP can include more or fewer SOCs, leads, wirebonds, and/or other structures. In another embodiment, wirebonds are omitted in favor of connecting SOCs using a flip-chip configuration. Moreover, the teachings herein can be used to provide an actively-controlled protection circuit that is suitable for providing overstress protection, such as ESD protection, in a variety of systems, including, but not limited to, systems on a chip (SOC), systems in package (SIP), systems on package (SOP), and/or systems on a board (SOB).

In the illustrated embodiment, the first SOC 1 is positioned over the paddle 3, and the second SOC 2 is positioned over the first SOC 1. Thus, the first and second SOCs 1, 2 are arranged in a stacked configuration, in this embodiment. The first and second SOCs 1, 2 can be physically and/or electrically connected to one another in a variety of ways, such as via adhesives, dielectrics, conductors, and/or encapsulation.

Electrical connections are provided between the first and second SOCs 1, 2 and/or between the SOCs and the SIP's lead(s) or pin(s) to provide desired electrical connectively.

For example, in the illustrated embodiment, the first wirebond 1 provides an electrical connection between a first pad of the first SOC 1 and a pad of the second SOC 2, and the second wirebond 8 provides an electrical connection between a second pad of the first SOC 1 and the lead finger 4. In certain implementations, one or more of the actively-controlled SCR(s) 5 are electrically connected between the first pad of the first SOC 1 and a discharge node, such as ground, and/or between the second pad of the first SOC 1 and the discharge node.

In the illustrated embodiment, the first and second pads of the first SOC 1 are electrically connected to one another via the on-chip passive circuit 7. In certain configurations, the lead finger 4 serves as a signaling node, such as an input and/or output (I/O) node, and the on-chip passive circuit 7 provides impedance that helps protect the second SOC 2 from damage from overstress by impeding the flow of charge.

The actively-controlled SCR(s) 5 can be used to protect the first SOC 1 and/or the second SOC 2 from damage from transient overstress events. The actively-controlled SCR(s) 5 can be implemented in accordance with any of the actively-controlled SCRs described herein. Although FIGS. 1A-1B illustrated one example of an electronic system that can include actively-controlled SCR(s), actively-controlled SCR(s) can be included in a wide variety of electronic systems.

In certain configurations, the first SOC 1 includes an analog front end (AFE), and the second SOC 2 includes a transceiver, such as advanced CMOS Universal Asynchronous Receiver/Transmitter (UART). In one embodiment, the second SOC 2 includes receive and/or transmit pads tested for compliancy with an IEC64000-4-2 ESD event.

The SIP 10 can be used in a wide variety of applications, including, but not limited to, sensor systems (for instance, a gas detection instrument), medical systems, industrial control systems, interface systems, power management systems, microelectromechanical system (MEMS) systems, automotive systems, and/or wireless infrastructure systems.

In certain implementations, the first and second SOCs 1, 2 are fabricated using different manufacturing technologies. In one example, the first SOC 1 is implemented using a low cost complementary metal oxide semiconductor (CMOS) process, such as a 0.18-um CMOS process, and the second SOC 2 is implemented using an advanced CMOS process, such as a CMOS process having dimensions of 90-nm or less. In another example, the first SOC 1 is implemented using a CMOS process, and the second SOC 2 is implemented using a compound semiconductor process, for instance, III-V semiconductor technology.

Accordingly, in certain implementations, the actively-controlled SCR(s) 5 of the first SOC 1 protect circuitry on the second SOC 2 that has a lower tolerance to overvoltage conditions and/or higher susceptibility to overstress relative to the first SOC 1. By implementing the first SOC 1 with actively-controlled SCRs rather than SCRs that provide clamping based on native junction breakdown, more robust overstress protection is provided. In particular, the actively-controlled SCR(s) 5 can exhibit relatively fast turn-on speed, which aids in reducing voltage overshoot in response to a transient overstress event. The fast turn-on speed can be provided by using one or more trigger signals to provide active control to at least one base of an embedded bipolar transistor of the SCR, thereby dynamically reducing the SCR's activation voltage.

Figure 2:
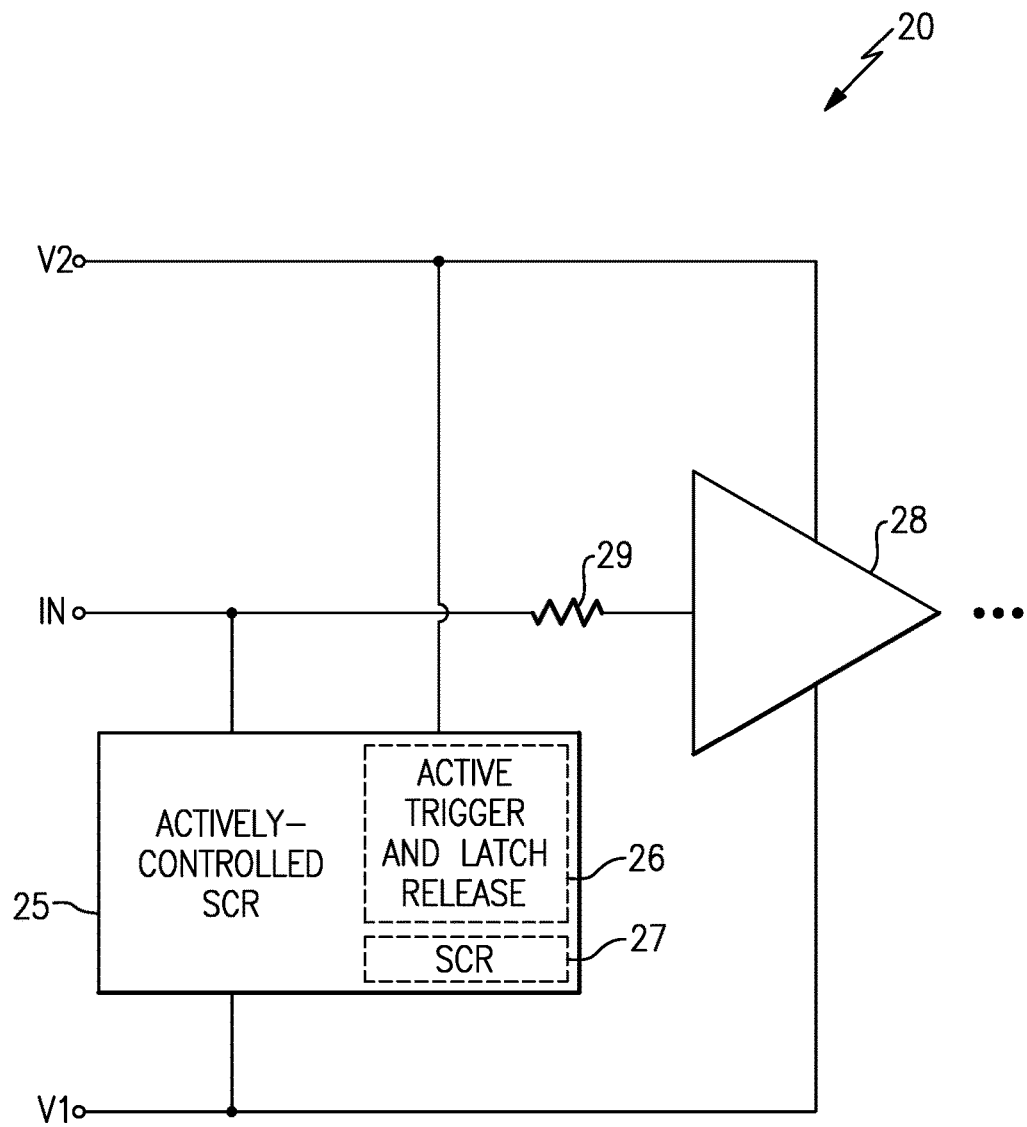
FIG. 2 is a schematic diagram of a transceiver interface according to one embodiment.

FIG. 2 is a schematic diagram of a transceiver interface 20 according to one embodiment. The transceiver interface 20 includes a signal node IN, a discharge node V1, a supply node V2, an actively-controlled thyristor or SCR 25, an input receiver 28, and an input resistor 29.

For clarity of the figures, only certain structures of the transceiver interface 20 are shown in FIG. 2. Thus, the transceiver interface 20 can include additional circuits, devices, and/or other structures.

In the illustrated embodiment, the input resistor 29 is electrically connected between the signal node IN and an input to the input receiver 28. Additionally, the input receiver 28 is electrically connected to the discharge node V1 and to the supply node V2, thereby powering the input receiver 28. In certain configurations, the discharge node V1 is electrically connected to a power low supply or ground voltage, and the supply node V2 is electrically connected to a power high supply voltage.

The actively-controlled SCR 25 includes a first terminal electrically connected to the signal node IN, a second terminal electrically connected to the discharge node V1, and a third terminal electrically connected to the supply node V2. As shown in FIG. 2, the actively-controlled SCR 25 includes an active trigger and latch release circuit 26 and an SCR 27.

When the transceiver interface 20 operates with normal signaling voltage levels or conditions, the actively-controlled SCR 25 operates in an OFF state in which the actively-controlled SCR 25 should not interfere with operation of the input receiver 28. However, in response to detecting the presence of a transient overstress event, the active trigger and latch release circuit 26 provides one or more triggering signals to the SCR 27 to selectively lower the SCR's activation voltage.

Thus, the SCR 27 can begin in a low-leakage/high-impedance OFF state. Upon detection of a transient overstress event satisfying one or more signaling conditions, the active trigger and latch release circuit 26 activates one or more trigger signals provided to the SCR 27, thereby enhancing the conductivity of the SCR 27 and selectively lowering the activation voltage at which the SCR 27 transitions from the high-impedance state to a high-current/low-impedance ON state. Thus, the SCR 27 operates as a latch. In one embodiment, the OFF state impedance can be, for example, in the range of about 10 to 1,000 GΩ, and the ON state impedance can be, for example, in the range of about 0.1 to 5Ω.

While the trigger signal(s) are activated, the SCR 27 has enhanced conductivity and a selectively decreased activation voltage. After the transient overstress event has passed, the active trigger and latch release circuit 26 deactivates the trigger signal(s) to release the SCR 27, and the SCR 27 returns to the low-leakage/high-impedance OFF state after passage of the transient overstress event.

Although the actively-controlled SCR 25 is illustrated in the context of protecting an input receiver of a transceiver interface, the teachings herein are applicable to a wide variety of applications. In another embodiment, the actively-controlled SCR 25 protects a signal node associated with an output transmitter of a transceiver interface. Thus, although the transceiver interface 20 of FIG. 2 illustrates one example of an IC interface that can include one or more SCRs implemented with active control of trigger and latch release, the teachings herein are applicable to other configurations of ICs and/or to other systems.

Figure 3A:
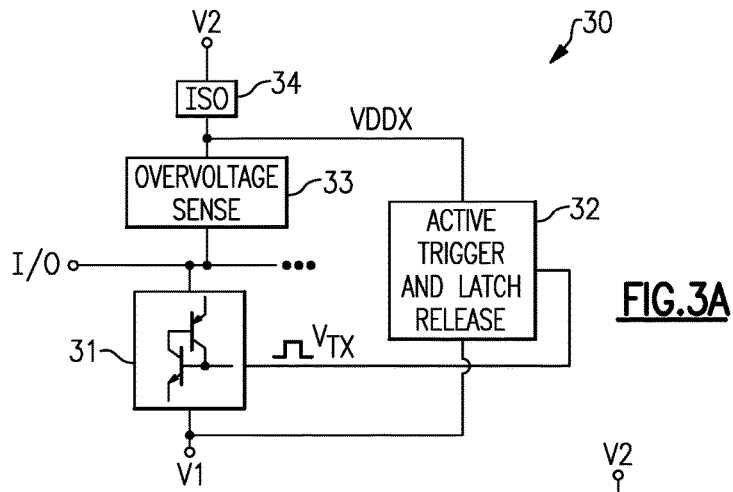
FIG. 3A is a schematic diagram of an actively-controlled thyristor or silicon controlled rectifier (SCR) according to one embodiment.

FIG. 3A is a schematic diagram of an actively-controlled SCR 30 according to one embodiment. The actively-controlled SCR 30 includes an SCR or thyristor 31, an active trigger and latch release circuit 32, an overvoltage sense circuit 33, and an isolation circuit 34.

The actively-controlled SCR 30 provides protection to circuitry that is electrically connected to a signal node I/O. As shown in FIG. 3A, the SCR 31 is electrically connected between the signal node I/O and a discharge node V1, and the SCR 31 receives a trigger voltage $V_{TX}$ from the active trigger and latch release circuit 32. When activated, the trigger voltage $V_{TX}$ decreases the SCR's activation voltage, thereby accelerating turn-on time of the actively-controlled SCR 30, which in turn can reduce voltage overshoot at the signal node I/O. As shown in FIG. 3A, the trigger voltage $V_{TX}$ can be provided to a base on an embedded NPN bipolar transistor of the SCR 31.

The illustrated overvoltage sense circuit 33 is electrically connected between the signal node I/O and a dummy supply node VDDX. The overvoltage sense circuit 33 controls a voltage of the dummy supply node VDDX based on a voltage of the signal node I/O. Thus, the overvoltage sense circuit 33 is used to sense the presence of an overstress condition at the signal node I/O.

Including the overvoltage sense circuit 33 provides a wide range of advantages relative to a configuration in which the active trigger and latch release circuit 32 is directly connected to the signal node I/O. For example, the overvoltage sense circuit 33 helps prevent mistrigger of the active trigger and latch release circuit 32 by providing low pass filtering to the voltage of the signal node I/O. Thus, the overvoltage sense circuit 33 can control the voltage of the dummy supply node VDDX based on the voltage of the signal node I/O, while providing filtering to prevent high frequency signaling on the signal node I/O from inadvertently triggering the active trigger and latch release circuit 32.

The overvoltage sense circuit 33 also serves to reduce the impact of capacitive loading of the active trigger and latch release circuit 32 on the signal node I/O. For example, the active trigger and latch release circuit 32 can include one or more capacitors, such as capacitors of RC networks used for detecting transient overstress events, and the overvoltage sense circuit 33 can reduce or eliminate capacitive loading on the signal node I/O arising from the capacitors. Thus, the signal node I/O can operate with higher frequency, enhanced performance, and/or wider bandwidth relative to a configuration in which the active trigger and latch release circuit 32 is directly connected to the signal node I/O.

As shown in FIG. 3A, the isolation circuit 34 is electrically connected between a supply node V2 and the dummy supply node VDDX. The isolation circuit 34 aids in biasing the dummy supply node VDDX based on a voltage of a power high supply voltage electrically connected to the supply node V2. In certain implementations, the supply node V2 is biased with a power high supply voltage that has a voltage level greater than a nominal operating voltage range of the signal node I/O.

The active trigger and latch release circuit 32 is electrically connected between the dummy supply node VDDX and the discharge node V1, and generates the trigger voltage VTX, in this embodiment. The active trigger and latch release circuit 32 detects presence of a transient overstress event at the signal node I/O based on the voltage of the dummy supply node VDDX, and selectively activates the trigger voltage VTX in response to detecting presence of the transient overstress event.

In certain configurations, the active trigger and latch release circuit 32 observes a rate of voltage change between the dummy supply node VDDX and the discharge node V1, and selectively activates the trigger voltage VTX when a qualifying transient overstress event is detected. However, the active trigger and latch release circuit 32 can detect for presence of a transient overstress event based on a multitude of detection conditions indicative of a transient overstress event's potential to damage sensitive electronics, including, but not limited to, observations of power, voltage, current, and/or charge.

In certain implementations, the active trigger and latch release circuit 32 determines that a transient overstress event is present in response to detecting a rapidly changing voltage for a sufficient period of time, such as a rising edge having a rate of voltage change in the range of about 0.1 V/ns to about 100 V/ns for a length of time in the range of about 1 ns to about 1000 ns. In certain implementations, the active trigger and latch release circuit 32 deactivates or releases one or more trigger signals in response to powered normal system operation conditions.

Figure 3B:
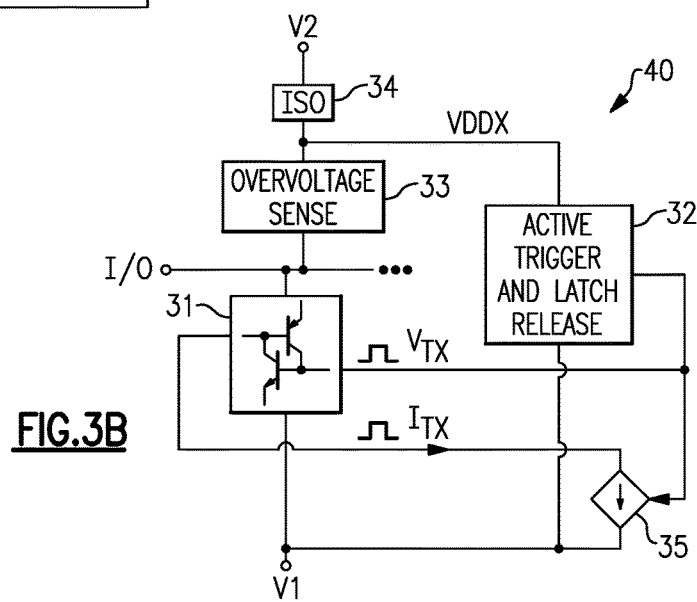
FIG. 3B is a schematic diagram of an actively-controlled SCR according to another embodiment.

FIG. 3B is a schematic diagram of an actively-controlled SCR 40 according to another embodiment. The actively-controlled SCR 40 includes an SCR 31, an active trigger and latch release circuit 32, an overvoltage sense circuit 33, an isolation circuit 34, and a voltage-controlled current source 35.

The actively-controlled SCR 40 of FIG. 3B is similar to the actively-controlled SCR 30 of FIG. 3A, except the actively-controlled SCR 40 of FIG. 3B further includes the voltage-controlled current source 35, which generates a trigger current $I_{TX}$ for the SCR 31. As shown in FIG. 3A, the trigger current $I_{TX}$ can be provided to a base on an embedded PNP bipolar transistor of the SCR 31. Controlling an SCR's activation voltage using multiple trigger signals, such as a combination of a trigger voltage and a trigger current, can provide greater control of the activation voltage and/or aid in providing a greater reduction in activation voltage relative to a configuration using a single trigger signal.

Additional details of the actively-controlled SCR 40 can be as described earlier.

Figure 3C:
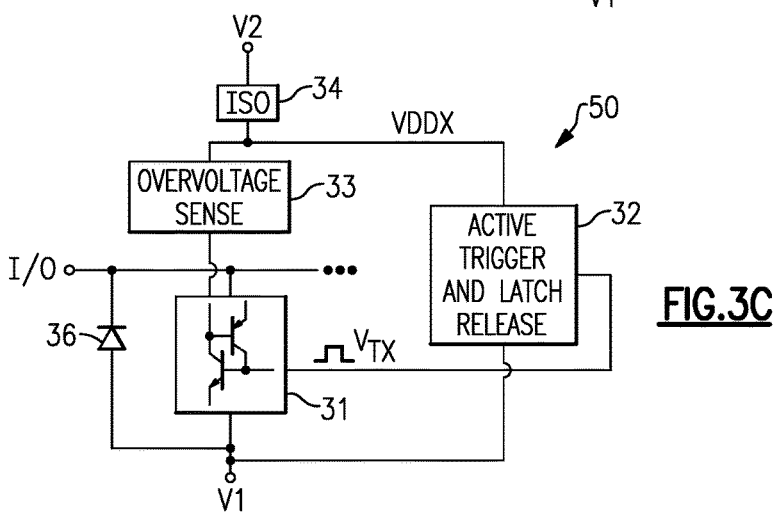
FIG. 3C is a schematic diagram of an actively-controlled SCR according to another embodiment.

FIG. 3C is a schematic diagram of an actively-controlled SCR 50 according to another embodiment. The actively-controlled SCR 50 includes an SCR 31, an active trigger and latch release circuit 32, an overvoltage sense circuit 33, an isolation circuit 34, and a reverse protection diode 36.

The actively-controlled SCR 50 of FIG. 3C is similar to the actively-controlled SCR 30 of FIG. 3A, except the actively-controlled SCR 50 of FIG. 3C further includes the reverse protection diode 36. Additionally, the embodiment of FIG. 3C illustrates an implementation in which the overvoltage sense circuit 33 is electrically connected between an internal node of the SCR 31 (for example, a base of the embedded PNP bipolar transistor) and the dummy supply node VDDX. Implementing an actively-controlled SCR in this manner enhances robustness against false triggering, but can also decrease turn-on speed.

As shown in FIG. 3C, the reverse protection diode 36 includes an anode electrically connected to the discharge node V1 and a cathode electrically connected to the signal node I/O. Including the reverse protection diode 36 can aid in providing protection to the signal node I/O against negative polarity transient overstress events that decrease the voltage of the signal node I/O relative to the discharge node V1. For example, the reverse protection diode 36 can activate to provide protection in response to a negative polarity transient overstress event that causes a voltage difference between the discharge node V1 and the signal node I/O to be greater than or equal to about the reverse protection diode's forward voltage.

Although the reverse protection diode 36 is illustrated as a separate component relative to the SCR 31, in certain implementations the reverse protection diode 36 is integrated in a layout of the SCR 31. For example, as will be discussed below with reference to the embodiments of FIGS. 5A and 5B, a reverse protection diode can be built into or integrated an SCR's layout. However, other configurations are possible, such as implementations in which the reverse protection diode includes a separate layout, thereby facilitating independent optimization for reverse condition.

Additional details of the actively-controlled SCR 50 can be as described earlier.

Figure 4:
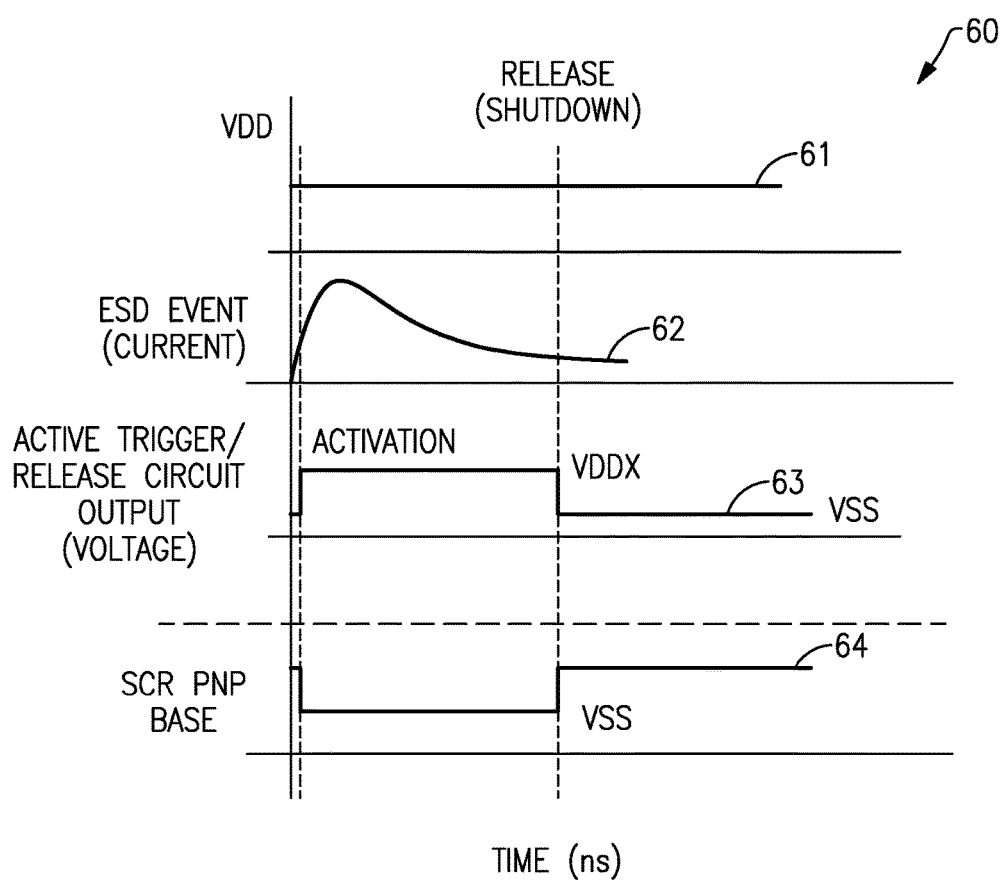
FIG. 4 is a graph of current and voltage versus time for an actively-controlled SCR according to one embodiment.

FIG. 4 is a graph 60 of current and voltage versus time for an actively-controlled SCR according to one embodiment. The graph 60 can represent one example of current and voltage characteristics for an implementation of the actively-controlled SCR 40 of FIG. 3B in which the discharge node V1 is electrically connected to a power low supply voltage VSS and in which the supply node V2 is electrically connected to a power high supply voltage VDD. Although FIG. 4 illustrates one example of current versus voltage characteristics for the actively-controlled SCR 40 of FIG. 3B, other current versus voltage characteristics are possible.

The graph 60 includes a first plot 61 of the supply node V2, which shows that the integrated circuit is powered, in this example. The actively-controlled SCRs described herein can be used to provide overstress protection during both powered-up and powered-down conditions, thereby providing robust protection both during active user operation and during handling and/or testing.

The graph 60 further includes a second plot 62 of current of the ESD event provided to a signal node (for example, I/O of FIG. 3B). The graph 60 further includes a third plot 63 of a trigger voltage (for example, $V_{TX}$ of FIG. 3B) provided to the base of the SCR's NPN bipolar transistor. As shown in FIG. 4, the trigger voltage is activated in response to an active trigger and latch release circuit detecting presence of a transient overstress event associated with the ESD current of the second plot 62. Additionally, the trigger voltage is deactivated in response to the active trigger and latch release circuit no longer detecting the presence of the transient overstress event.

The graph 60 further includes a fourth plot 64 of the voltage of the base of the SCR's PNP bipolar transistor. As shown in FIG. 4, the base voltage of the PNP bipolar transistor can be pulled down by activation of a trigger current (for example, $I_{TX}$ of FIG. 3B). When the trigger current is deactivated by the active trigger and latch release circuit, the base voltage of the PNP can return to normal operating voltage levels, and the SCR can release thereafter. In this embodiment, the base voltage of the PNP bipolar transistor is electrically floating, or operates substantially without direct voltage or current biasing, when the trigger current is deactivated.

Figure 5A:
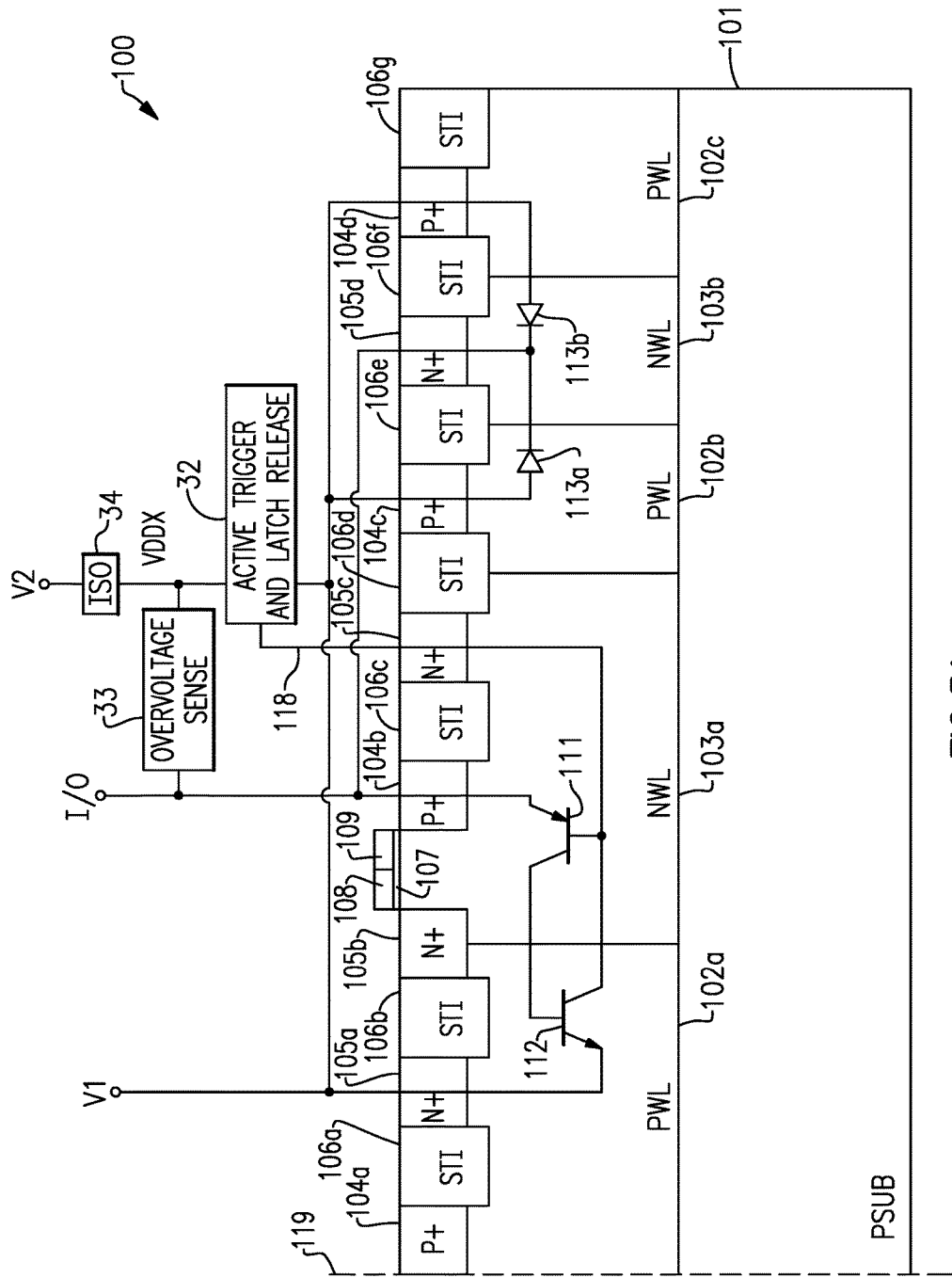
FIG. 5A is an annotated schematic cross-section of an actively-controlled SCR according to one embodiment.

FIG. 5A is an annotated schematic cross-section of an actively-controlled SCR 100 according to one embodiment. Although FIG. 5A illustrates one example of a suitable layout implementation for an actively-controlled SCR, actively-controlled SCRs can be implemented in a wide variety of ways. For example, a wide variety of device cross-sections and device layouts can be used in accordance with the teachings herein.

The actively-controlled SCR 100 is fabricated in a p-type substrate (PSUB) 101, and includes a first p-type well (PWL) 102*a*, a second PWL 102*b*, a third PWL 102*c*, a first n-type well (NWL) 103*a*, a second NWL 103*b*, a first p-type active (P+) region 104*a*, a second P+ region 104*b*, a third P+ region 104*c*, a fourth P+ region 104*d*, a first n-type active (N+) region 105*a*, a second N+ region 105*b*, a third N+ region 105*c*, a fourth N+ region 105*d*, a first shallow trench isolation (STI) region 106*a*, a second STI region 106*b*, a third STI region 106*c*, a fourth STI region 106*d*, a fifth STI region 106*e*, a sixth STI region 106*f*, a seventh STI region 106*g*, a dielectric region 107, an n-type doped conductive region 108, and a p-type doped conductive region 109.

The actively-controlled SCR 100 has been schematically annotated to show certain electrical connections, devices, and circuits. For example, as shown in FIG. 5A, a signal node I/O, a discharge node V1, a supply node V2, a dummy supply node VDDX, an active trigger and latch release circuit 32, an overvoltage sense circuit 33, an isolation circuit 34, a PNP bipolar transistor 111, an NPN bipolar transistor 112, a first reverse protection diode 113*a*, a second reverse protection diode 113*b*, and electrical connections therebetween have been annotated with respect to the illustrated device cross-section.

Although schematically depicted above the device's cross-section using boxes, the active trigger and latch release circuit 32, the overvoltage sense circuit 33, and the isolation circuit 34 can be fabricated in the PSUB 101, such as in a portion of the PSUB 101 that is not visible in the illustrated cross-section. For example, the active trigger and latch release circuit 32, the overvoltage sense circuit 33, and the isolation circuit 34 can include passive components, such as resistors, capacitors, and/or inductors, and active components, such as transistors and/or diodes, fabricated in the PSUB 101. Although electrical connections are illustrated schematically using lines, persons having ordinary skill in the art will appreciate that the annotated electrical connections can be made in part using metallization via back-end processing. Moreover, in certain implementations, bond pads or other structures can be included, and can correspond to certain nodes, including, but not limited to, the signal node I/O, the discharge node V1, and/or the supply node V2. Such details are omitted for clarity of the figures.

As shown in FIG. 5A, the first NWL 103*a* is positioned between the first and second PWLs 102*a*, 102*b*, the second PWL 102*b* is positioned between the first and second NWLs 103*a*, 103*b*, and the second NWL 103*b* is positioned between the second and third PWLs 102*b*, 102*c*. Additionally, the first P+ region 104*a* and the first N+ region 105*a* are formed in the first PWL 102*a*. Furthermore, the second N+ region 105*b* is formed along a boundary between the first PWL 102*a* and first NWL 103*a*. Additionally, the second P+ region 104*b* and the third N+ region 105*c* are formed in the first NWL 103*a*. Furthermore, the third P+ region 104*c* is formed in the second PWL 102*b*, the fourth N+ region 105*d* is formed in the second NWL 103*b*, and the fourth P+ region 104*d* is formed in the third PWL 102*c*. As illustrated in FIG. 5A, STI regions 106*a*-106*g* are formed between active regions as shown.

In certain implementations, the actively-controlled SCR 100 is implemented in an annular configuration. In one example, the actively-controlled SCR 100 can be implemented to be line symmetric with respect to line 119. Although the actively-controlled SCR 100 can be implemented in an annular layout arrangement, layout configurations for the actively-controlled SCRs need not be annular. For instance, in another example, an actively-controlled SCR can be implemented in a planar layout arrangement.

In the illustrated configuration, the actively-controlled SCR 100 is formed directly in the P-SUB 101. However, the teachings herein are applicable to other configurations, such as implementations in which a substrate includes a p-type epitaxial layer over a doped or undoped support substrate, and the actively-controlled SCR 100 is fabricated in the p-type epitaxial layer. Although not illustrated in FIG. 5A, the P-SUB 101 typically includes other devices or structures formed therein.

The illustrated STI regions 106a-106g can be formed in a variety of ways. In one example, formation of the STI regions 106a-106g involves etching trenches in the P-SUB 101, filling the trenches with a dielectric, such as silicon dioxide ($SiO_2$), and removing the excess dielectric using any suitable method, such as chemical-mechanical planarization. Although illustrated as STI regions, other implementations of isolation between active regions are possible.

As shown in FIG. 5A, the discharge node V1 is electrically connected to the first N+ region 105a, to the third P+ region 104c, and to the fourth P+ region 104d. Additionally, the signal node I/O is electrically connected to second P+ region 104b and the fourth N+ region 105d. Electrically connecting the discharge node V1 and the signal node I/O in this manner serves to electrically connect the SCR and reverse protection diode structures in a manner similar to that shown in FIG. 3C.

For example, the illustrated cross-section has been annotated to show the PNP bipolar transistor 111, the NPN bipolar transistor 112, the first reverse protection diode 113a, and the second reverse protection diode 113b formed by the n-type and p-type doped regions of the cross-section. As shown in FIG. 5A, the PNP bipolar transistor 111 and the NPN bipolar transistor 112 are cross-coupled with one another, and the emitter of the PNP bipolar transistor 111 and the emitter of the NPN bipolar transistor 112 are electrically connected to signal node I/O and the discharge node V1, respectively. Additionally, the reverse protection diodes 113a, 113b operate in parallel with another, with the anodes of the reverse protection diodes 113a, 113b electrically connected to the discharge node V1 and with the cathodes of the reverse protection diodes 113a, 113b electrically connected to the signal node I/O.

In the illustrated embodiment, the second N+ region 105b is formed along a boundary between the first PWL 102a and the first NWL 103a. Implementing the second N+ region 105b in this manner increases a number of electrons near the boundary of the wells, thereby helping to achieve a desired SCR activation voltage. However, other implementations are possible. Additionally, the illustrated embodiment includes the p-type doped conductive region 108 and the p-type doped conductive region 109 formed over the first NWL 103a, with the dielectric region 107 formed between the conductive regions and a surface of the first NWL 103a. The conductive regions 108, 109 serve as dummy deep-oxide formation blocking field plates that operate to accelerate device turn-on response by accelerating conduction close to the semiconductor surface. However, other implementations are possible.

The illustrated isolation circuit 34 is electrically connected between the supply node V2 and the dummy supply node VDDX. Additionally, the overvoltage sense circuit 33 is electrically connected between the signal node I/O and the dummy supply node VDDX. Furthermore, the active trigger and latch release circuit 32 is electrically connected between the dummy supply node VDDX and the discharge node V1.

The active trigger and latch release circuit 32 generates a trigger signal 118, in this embodiment. The trigger signal 118 is provided to the third N+ region 105c, and thus to the base of the PNP bipolar transistor 111, in this embodiment. In certain implementations, an active trigger and latch release circuit generates a trigger signal for the base of the PNP bipolar transistor 111 and/or for the base of the NPN bipolar transistor 112. For example, a trigger signal can be provided to the base of the NPN bipolar transistor 112 via the first P+ region 104a.

Figure 5B:
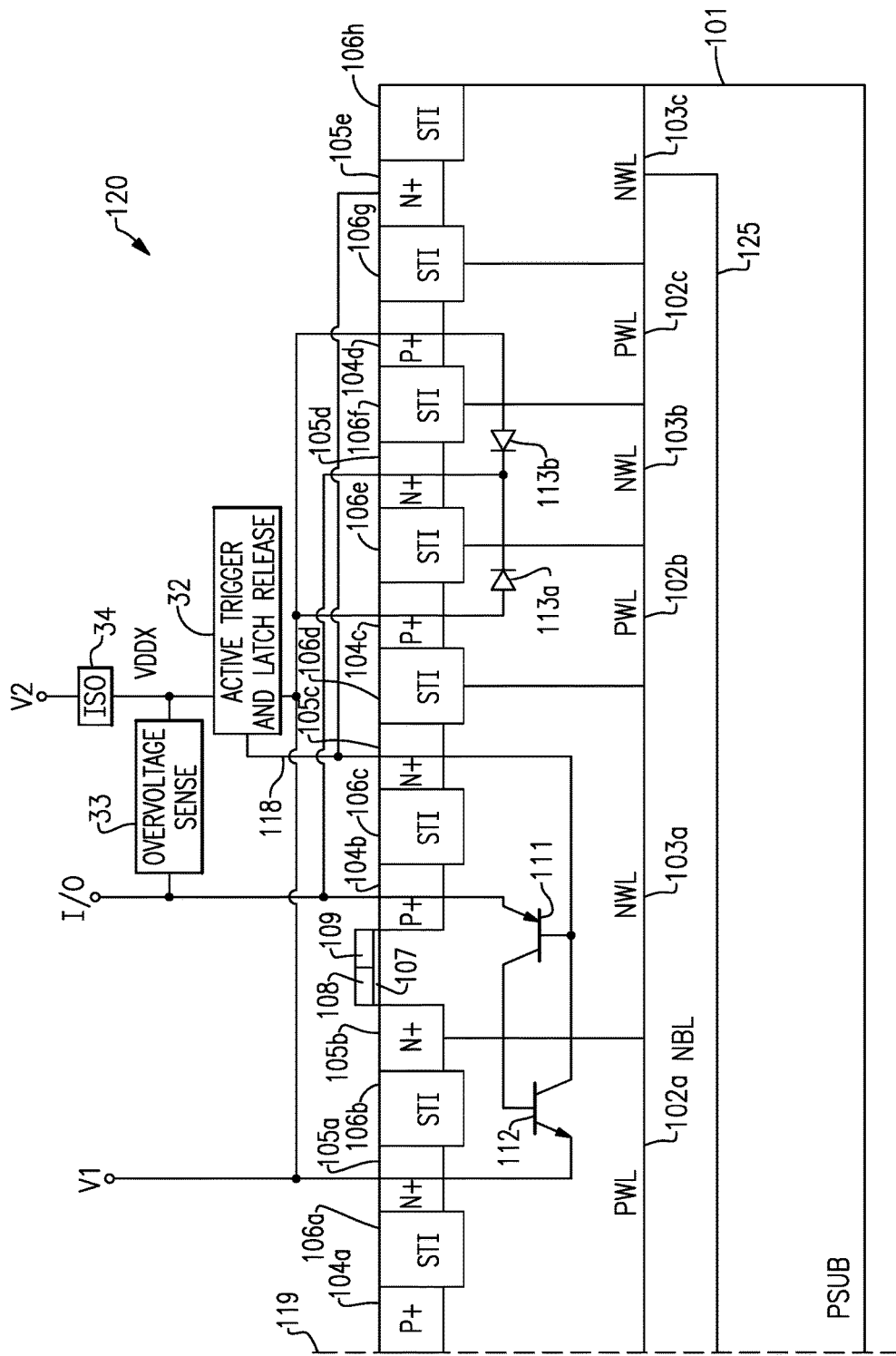
FIG. 5B is an annotated schematic cross-section of an actively-controlled SCR according to another embodiment.

FIG. 5B is an annotated schematic cross-section of an actively-controlled SCR 120 according to another embodiment.

The actively-controlled SCR 120 of FIG. 5B is similar to the actively-controlled SCR of FIG. 5A, except that the actively-controlled SCR 120 of FIG. 5B further includes a third NWL 103c, a fifth N+ region 105e, an eighth STI region 106h, and an n-type buried layer (NBL) 125. As shown in FIG. 5B, the NBL 125 extends beneath the PWLs 102a-102c, beneath the NWLs 103a-103b, and beneath a portion of the NWL 103c. The N+ region 105e is formed in the third NWL 103c. As shown in FIG. 5B, the trigger signal 118 is provided to the N+ region 105e.

In the illustrated embodiment, the NBL 125 and the third NWL 103c operate as an n-type isolation structure that electrically isolates the PWLs 102a-102c from the P-SUB 51. Although the actively-controlled SCR 120 includes one example of an n-type isolation structure that can be used to isolate p-type well regions, the teachings herein are applicable to other configurations of n-type isolation structures. For instance, in another example, an n-type isolation structure can be implemented using deep n-well technologies.

Additional details of the actively-controlled SCR 120 can be similar to those described earlier.

With reference to FIGS. 5A and 5B, terms such as above, below, over and so on refer to a device orientated as shown in the figures and should be construed accordingly. It should also be appreciated that because regions within a semiconductor device are defined by doping different parts of a semiconductor material with differing impurities or differing concentrations of impurities, discrete physical boundaries between different regions may not actually exist in the completed device but instead regions may transition from one to another. Some boundaries as shown in FIGS. 5A and 5B are of this type and are illustrated as abrupt structures merely for the assistance of the reader. As persons having ordinary skill in the art will appreciate, p-type regions can include a p-type semiconductor material, such as boron, as a dopant. Furthermore, n-type regions can include an n-type semiconductor material, such as phosphorus, as a dopant. Persons having ordinary skill in the art will appreciate various concentrations of dopants in regions described above.

Figure 6A:
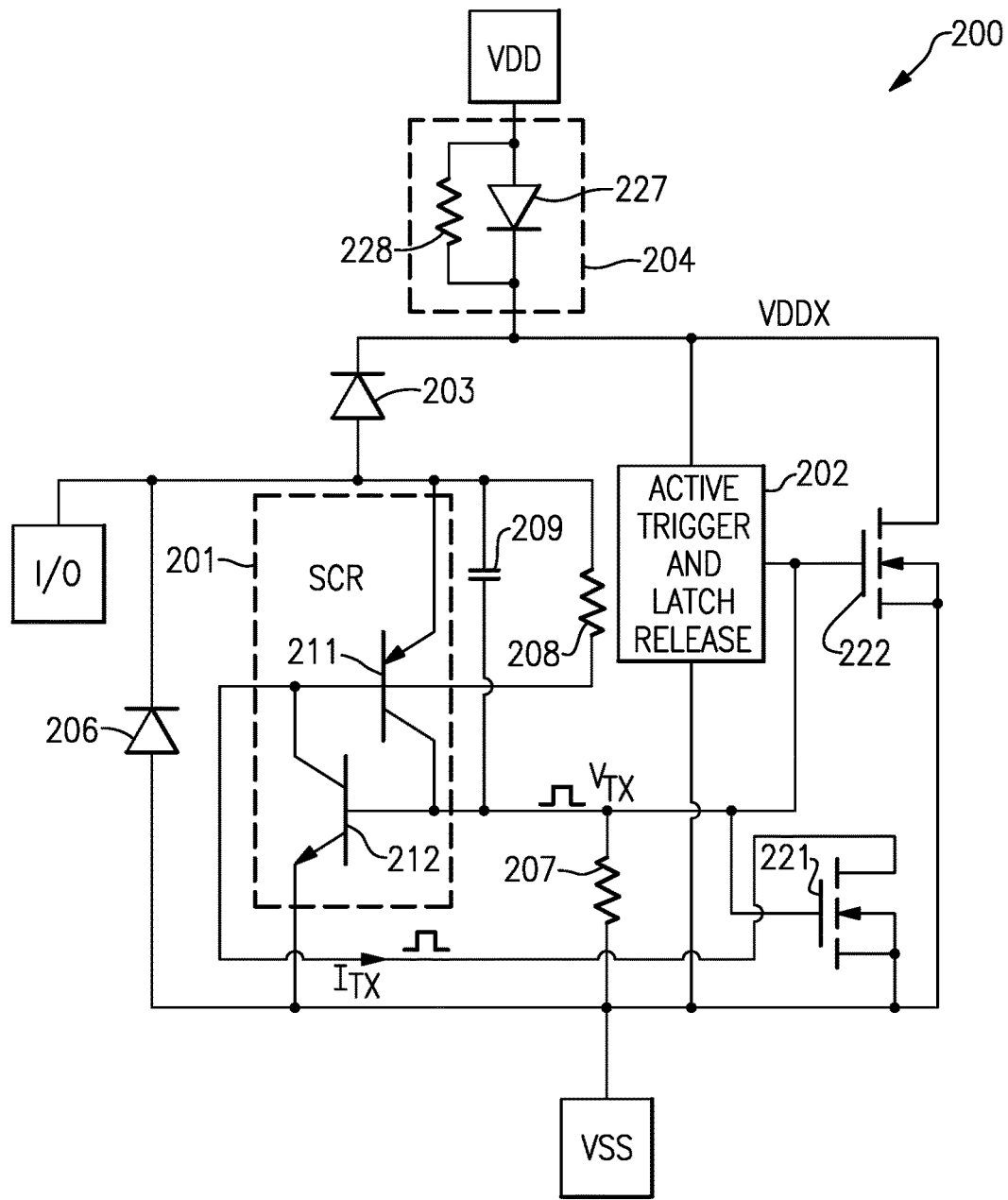
FIG. 6A is a schematic diagram of an actively-controlled SCR according to another embodiment.

FIG. 6A is a schematic diagram of an actively-controlled SCR 200 according to another embodiment. The actively-controlled SCR 200 includes an SCR or thyristor 201, an active trigger and latch release circuit 202, an overvoltage sense diode 203, an isolation circuit 204, a reverse protection diode 206, a first resistor 207, a second resistor 208, a bond pad capacitor 209, a current source n-type metal oxide semiconductor (NMOS) transistor 221, a clamp NMOS transistor 222, a signal pad I/O, a ground or power low pad VSS, and a power high pad VDD.

The SCR 201 includes a PNP bipolar transistor 211 and an NPN bipolar transistor 212 that are cross-coupled with one another. For example, a base of the PNP bipolar transistor 211 is electrically connected to a collector of the NPN bipolar transistor 212, and a base of the NPN bipolar transistor 212 is electrically connected to a collector of the PNP bipolar transistor 212. As shown in FIG. 6A, an emitter of the PNP bipolar transistor 211 is electrically connected to the signal pad I/O, and an emitter of the NPN bipolar transistor 212 is electrically connected to the ground pad VSS.

The actively-controlled SCR 200 provides protection to circuitry that is electrically connected to a signal pad I/O. As shown in FIG. 6A, the SCR 201 is electrically connected between the signal pad I/O and a ground pad VSS, and the SCR 201 receives a trigger voltage $V_{TX}$ from the active trigger and latch release circuit 202, in this embodiment. When activated, the trigger voltage $V_{TX}$ decreases the SCR's activation voltage, thereby helping to speed-up turn-on of the actively-controlled SCR 200, which in turn can reduce voltage overshoot at the signal pad I/O. As shown in FIG. 6A, the trigger voltage $V_{TX}$ is provided to the base on the NPN bipolar transistor 212.

The SCR 201 also receives the trigger current $I_{TX}$ from the current source NMOS transistor 221, in this embodiment. A gate of the current source NMOS transistor 221 is controlled using the trigger voltage $V_{TX}$, and thus the active trigger and latch release circuit 202 controls activation and deactivation of the trigger current $I_{TX}$. Although shown as separate from the active trigger and latch release circuit 202, in certain implementations the current source NMOS transistor 221 or other current source is integrated with the active trigger and latch release circuit 202.

The illustrated embodiment further includes the clamp NMOS transistor 222, which is electrically connected between the dummy supply node VDDX and the ground pad VSS. As shown in FIG. 6A, a gate of the clamp NMOS transistor 222 is controlled by the trigger voltage $V_{TX}$, and thus the active trigger and latch release circuit 202 controls activation and deactivation of the clamp NMOS transistor 222. Including the clamp NMOS transistor 222 can further enhance overstress protection.

As shown in FIG. 6A, the first resistor 207 is included between the base and emitter of the NPN bipolar transistor 212, and the second resistor 208 is included between the base and emitter of the PNP bipolar transistor 211. The first and second resistors 207, 208 aid in controlling the SCR's activation voltage and/or holding voltage. In one embodiment, the first resistor 207 has a resistance in the range of 5Ω to 5 kΩ, and the second resistor 208 has a resistance in the range of 5Ω to 1 kΩ.

The illustrated embodiment also includes the reverse protection diode 206, which includes an anode electrically connected to ground pad VSS and a cathode electrically connected to the signal pad I/O. The reverse protection diode 206 aids in providing protection against transient overstress events that decrease a voltage of the signal pad I/O relative to the ground pad VSS.

As shown in FIG. 6A, the overvoltage sense diode 203 includes an anode electrically connected to the signal pad I/O and a cathode electrically connected to the dummy supply node VDDX. The overvoltage sense diode 203 controls a voltage of the dummy supply node VDDX based on a voltage of the signal pad I/O. In particular, when the voltage of the signal pad I/O increases above that of the supply pad VDD, the overvoltage sense diode 203 controls the dummy supply node VDDX to be about equal to the voltage of the signal pad I/O minus the diode's forward voltage. Thus, the overvoltage sense diode 203 increases the voltage of the dummy supply node VDDX in response to a positive polarity transient overstress event at the signal pad I/O.

Including the overvoltage sense diode 203 provides a wide range of advantages relative to a configuration in which the active trigger and latch release circuit 202 is directly connected to the signal pad I/O. For example, the overvoltage sense diode 203 helps prevent mistrigger of the active trigger and latch release circuit 202 while providing filtering that prevents high frequency signaling on the signal pad I/O from inadvertently triggering the active trigger and latch release circuit 202. Additionally, the overvoltage sense diode 203 also serves to reduce the impact of capacitive loading of the active trigger and latch release circuit 202 on the signal pad I/O. For example, the active trigger and latch release circuit 202 can include one or more relatively large capacitors, and the overvoltage sense diode 203 can at least partially shield the signal pad I/O from capacitive loading associated with the capacitors.

Although the illustrate embodiment includes an overvoltage sense circuit implemented using a diode, other implementations of overvoltage sense circuits can be used.

As shown in FIG. 6A, the isolation circuit 204 is electrically connected between the supply pad VDD and the dummy supply node VDDX. In the illustrated embodiment, the isolation circuit 204 includes an isolation resistor 228 and an isolation diode 227 electrically connected in parallel with one another, with the anode of the isolation diode 227 electrically connected to the supply pad VDD and the cathode of the isolation diode 227 electrically connected to the dummy supply node VDDX. However, other implementations of isolation circuits can be used.

The isolation circuit 204 aids in biasing the dummy supply node VDDX based on a voltage of a power high supply voltage electrically connected to the supply pad VDD. In certain implementations, the supply pad VDD is biased with a power high supply voltage that has a voltage level greater than a nominal operating voltage range of the signal pad I/O.

The active trigger and latch release circuit 202 is electrically connected between the dummy supply node VDDX and the ground pad VSS, and generates the trigger voltage $V_{TX}$, in this embodiment. The active trigger and latch release circuit 202 detects presence of a transient overstress event at the signal pad I/O based on the voltage of the dummy supply node VDDX, and selectively activates the trigger voltage $V_{TX}$ in response to detecting presence of the transient overstress event.

The illustrated embodiment includes the bond pad capacitor 209, which aids in coupling the trigger voltage $V_{TX}$ in response to voltage changes associated with a transient overstress event, thereby enhancing turn-on time. Thus, a capacitance of a bond pad can facilitate active circuit implementation by providing capacitive coupling that aids in detecting a transient overstress event. Although including the bond pad capacitor 209 can enhance turn-on speed, the bond pad capacitor 209 can also increase capacitive loading of the signal pad I/O.

The bond pad capacitor 209 is implemented in part using a capacitance of the signal pad I/O. For example, the bond pad capacitor 209 can include a first plate implemented using metallization of the signal pad I/O bond pad structure, and a second plate implemented using a metallization layer positioned beneath the bond pad structure. In one embodiment, the bond pad capacitor 209 has a capacitance of at least 100 fF.

Figure 6B:
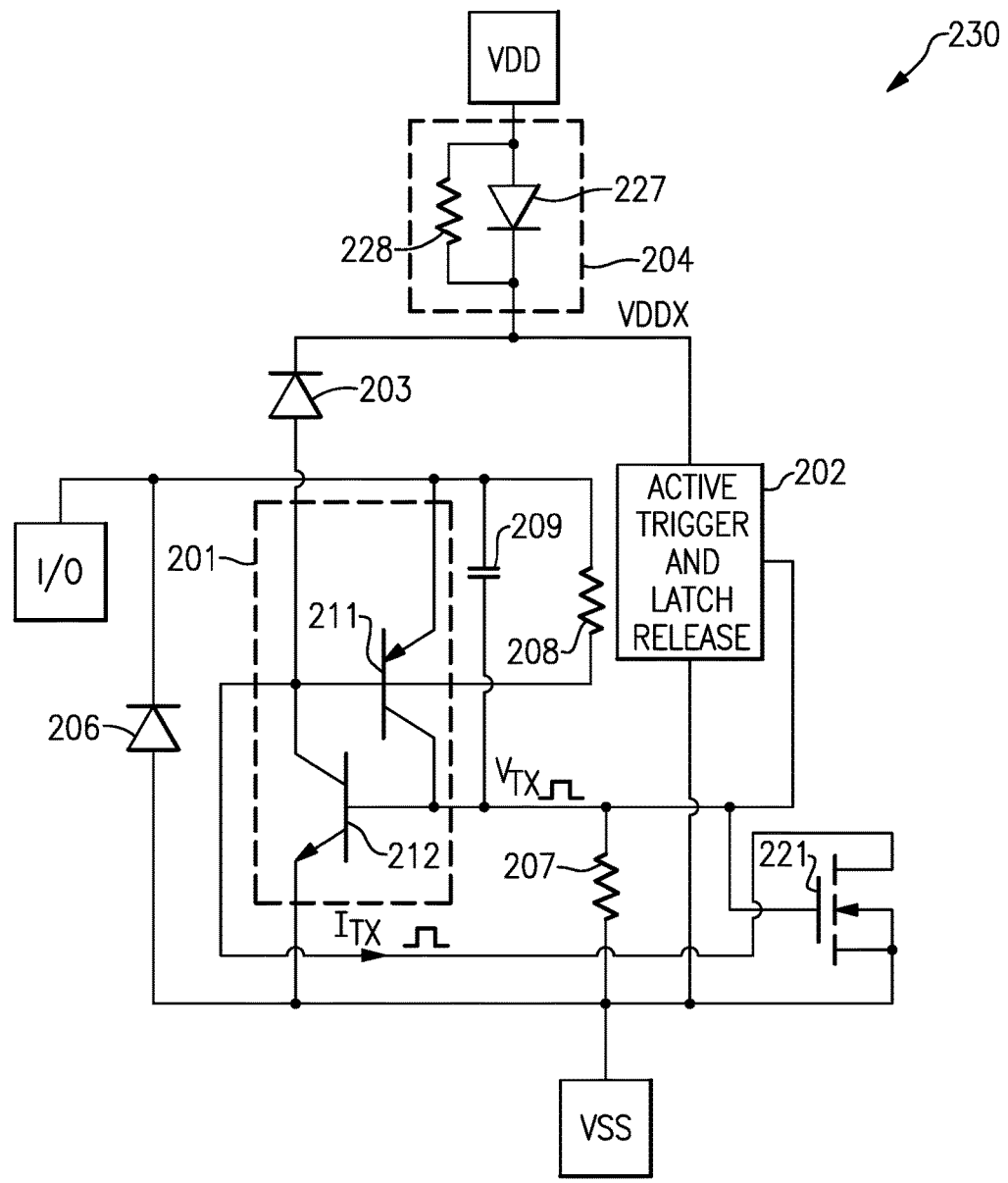
FIG. 6B is a schematic diagram of an actively-controlled SCR according to another embodiment.

FIG. 6B is a schematic diagram of an actively-controlled SCR 230 according to another embodiment. The actively-controlled SCR 230 includes an SCR 201, an active trigger and latch release circuit 202, an overvoltage sense diode 203, an isolation circuit 204, a reverse protection diode 206, a first resistor 207, a second resistor 208, a bond pad capacitor 209, a current source NMOS transistor 221, a signal pad I/O, a ground pad VSS, and a power high pad VDD.

The actively-controlled SCR 230 of FIG. 6B is similar to the actively-controlled SCR 200 of FIG. 6A, except that the actively-controlled SCR 230 of FIG. 6B illustrates a configuration in which the anode and cathode of the overvoltage sense diode 203 are electrically connected to the base of the PNP bipolar transistor 211 and the dummy supply node VDDX, respectively. Implementing the actively-controlled SCR 230 in this manner decreases susceptibility to false or unintended activation, but can also decrease turn-on speed. The illustrated embodiment also omits the clamp NMOS transistor 222 shown in FIG. 6B. However, in another embodiment, the NMOS transistor 222 is included.

Additional details of the actively-controlled SCR 230 can be similar to those described earlier.

Figure 6C:
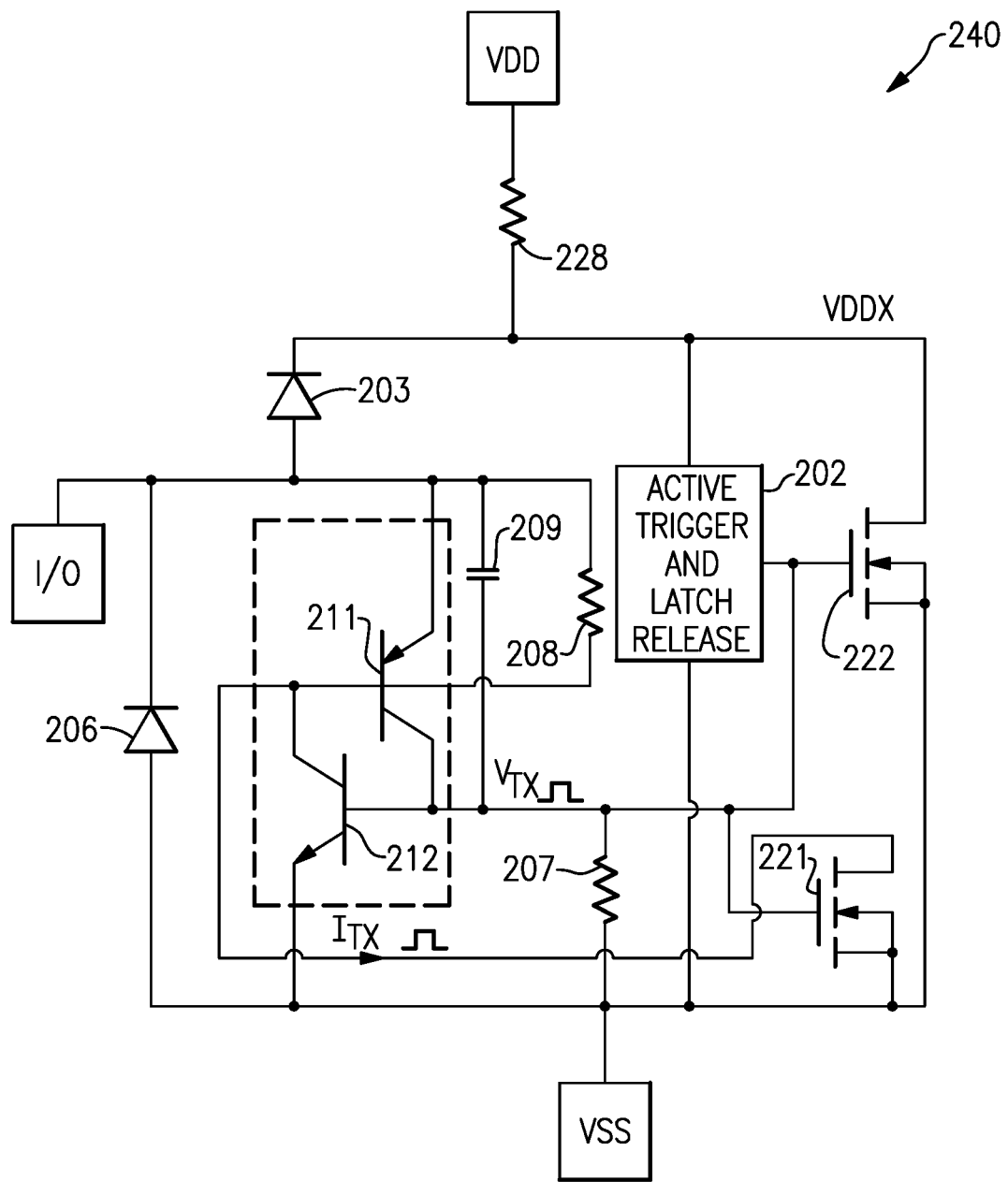
FIG. 6C is a schematic diagram of an actively-controlled SCR according to another embodiment.

FIG. 6C is a schematic diagram of an actively-controlled SCR 240 according to another embodiment. The actively-controlled SCR 240 includes an SCR 201, an active trigger and latch release circuit 202, an overvoltage sense diode 203, an isolation resistor 228, a reverse protection diode 206, a first resistor 207, a second resistor 208, a bond pad capacitor 209, a current source NMOS transistor 221, a clamp NMOS transistor 222, a signal pad I/O, a ground pad VSS, and a power high pad VDD.

The actively-controlled SCR 240 of FIG. 6C is similar to the actively-controlled SCR 200 of FIG. 6A, except that the actively-controlled SCR 240 of FIG. 6C illustrates a configuration that omits the isolation diode 227 of FIG. 6A.

Additional details of the actively-controlled SCR 240 can be similar to those described earlier.

Figure 6D:
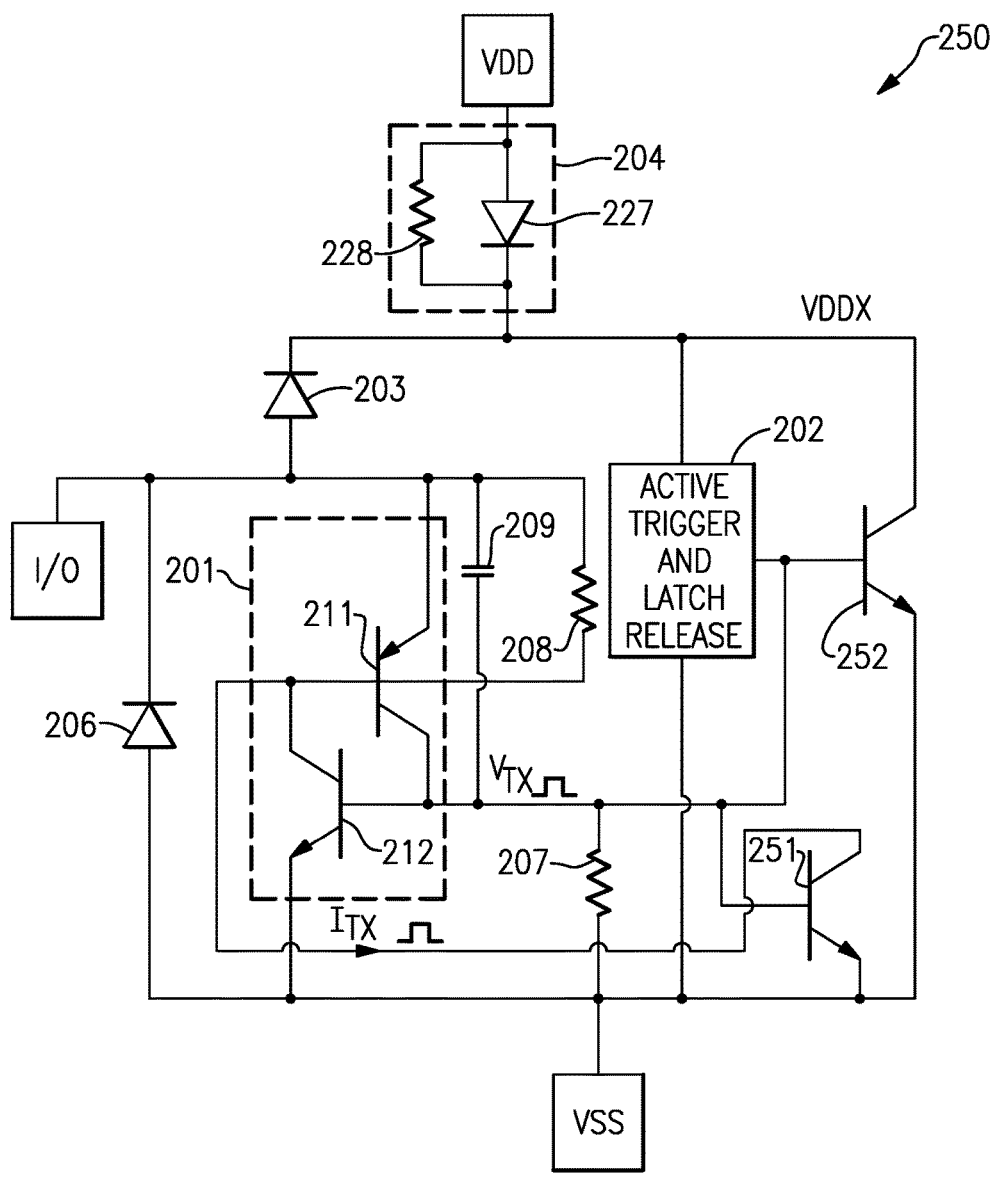
FIG. 6D is a schematic diagram of an actively-controlled SCR according to another embodiment.

FIG. 6D is a schematic diagram of an actively-controlled SCR 250 according to another embodiment. The actively-controlled SCR 250 includes an SCR 201, an active trigger and latch release circuit 202, an overvoltage sense diode 203, an isolation circuit 204, a reverse protection diode 206, a first resistor 207, a second resistor 208, a bond pad capacitor 209, a current source NPN bipolar transistor 251, a clamp NPN bipolar transistor 252, a signal pad I/O, a ground pad VSS, and a power high pad VDD.

The actively-controlled SCR 250 of FIG. 6D is similar to the actively-controlled SCR 200 of FIG. 6A, except that the actively-controlled SCR 250 of FIG. 6D illustrates a configuration in which the current source NMOS transistor 221 is replaced with the current source NPN bipolar transistor 251 and in which the clamp NMOS transistor 222 is replaced with the clamp NPN bipolar transistor 252.

Additional details of the actively-controlled SCR 250 can be similar to those described earlier.

Figure 6E:
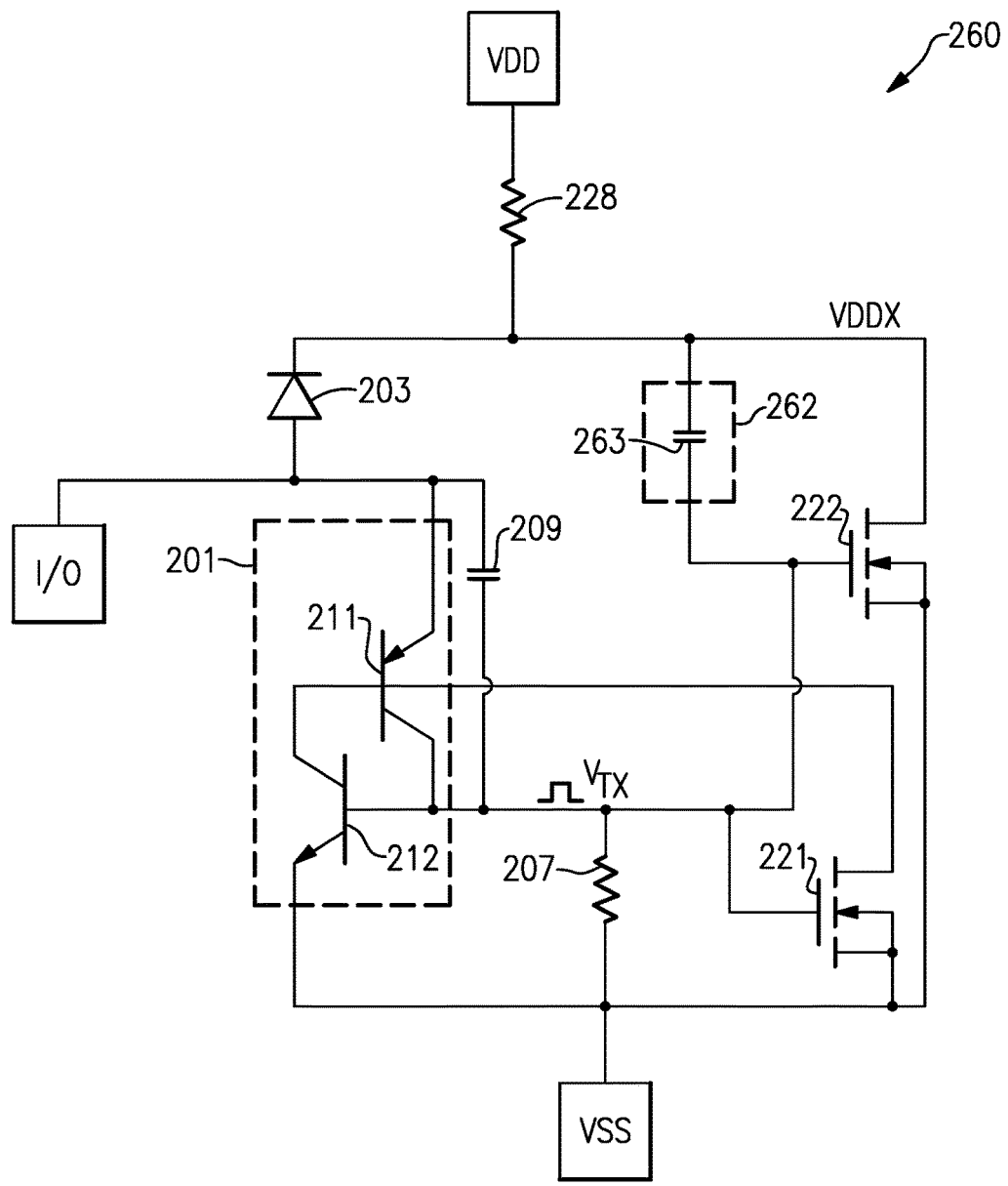
FIG. 6E is a schematic diagram of an actively-controlled SCR according to another embodiment.

FIG. 6E is a schematic diagram of an actively-controlled SCR 260 according to another embodiment. The actively-controlled SCR 260 includes an SCR 201, an active trigger and latch release circuit 262, an overvoltage sense diode 203, an isolation resistor 228, a resistor 207, a bond pad capacitor 209, a current source NMOS transistor 221, a clamp NMOS transistor 222, a signal pad I/O, a ground pad VSS, and a power high pad VDD.

The actively-controlled SCR 260 of FIG. 6E is similar to the actively-controlled SCR 200 of FIG. 6A, except that the actively-controlled SCR 260 of FIG. 6E omits the reverse protection diode 206, the second resistor 208, and the isolation diode 227 shown in FIG. 6A. However, other implementations are possible, including, for example, implementations that include one or more of these components. Additionally, the actively-controlled SCR 260 of FIG. 6E illustrates a configuration of in which the active trigger and latch release circuit 262 includes a capacitor 263 electrically connected between the dummy supply node VDDX and the base of the NPN bipolar transistor 212.

Although one embodiment of an active trigger and latch release circuit is shown in FIG. 6E, an active trigger and latch release circuit can be implemented in a wide variety of ways.

Additional details of the actively-controlled SCR 260 can be similar to those described earlier.

Figure 6F:
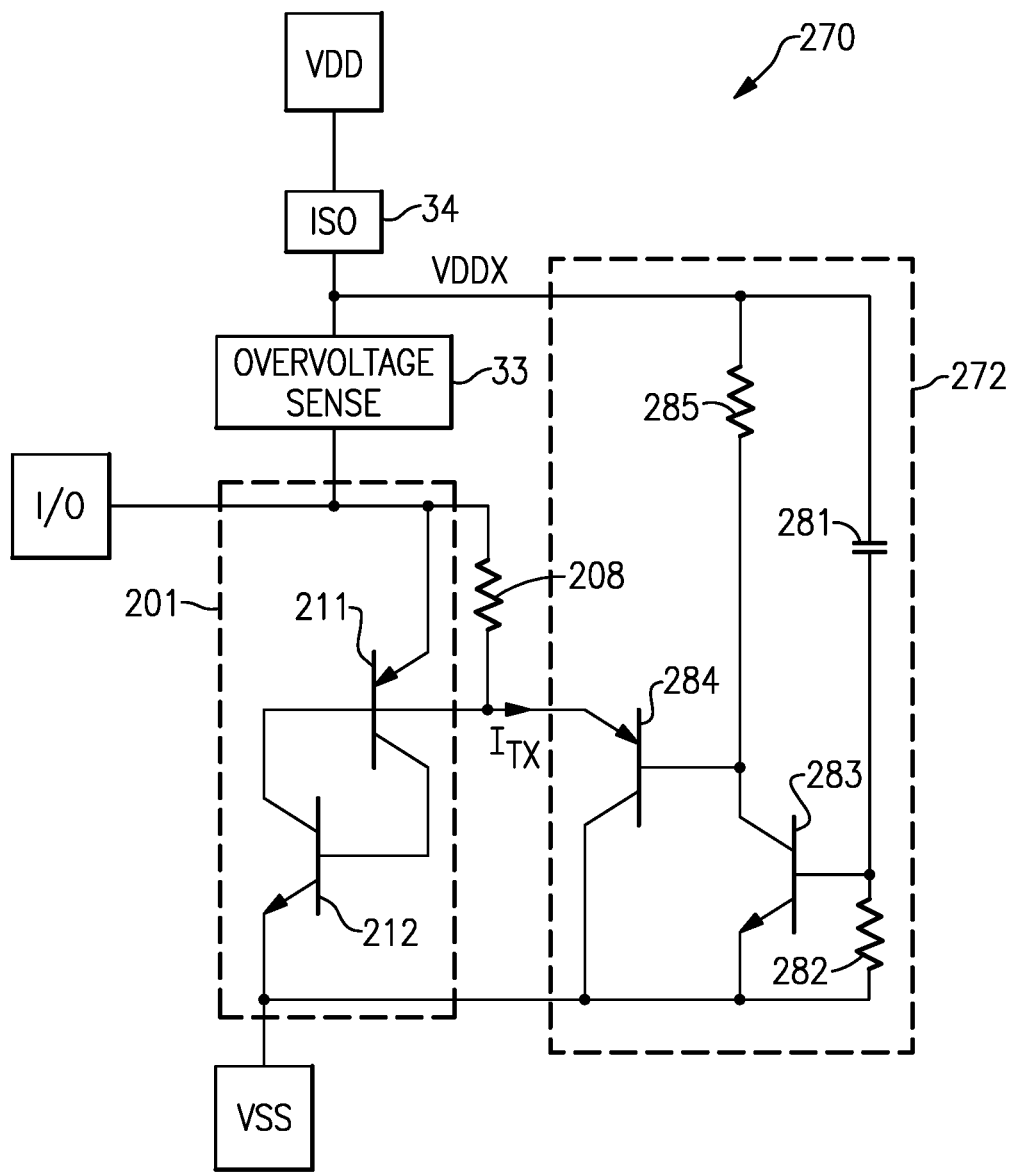
FIG. 6F is a schematic diagram of an actively-controlled SCR according to another embodiment.

FIG. 6F is a schematic diagram of an actively-controlled SCR 270 according to another embodiment. The actively-controlled SCR 270 includes an overvoltage sense circuit 33, an isolation circuit 34, an SCR 201, a resistor 208, a signal pad I/O, a ground pad VSS, and a power high pad VDD, which can be as described earlier.

The actively-controlled SCR 270 further includes an active trigger and latch release circuit 272, which illustrates one embodiment of an active trigger and latch release circuit that can be used to provide active control of latching and latch release of an SCR. However, an active trigger and latch release circuit can be implemented in other ways.

The illustrated active trigger and latch release circuit 272 includes a detection capacitor 281, a detection resistor 282, an NPN bipolar transistor 283, a PNP bipolar transistor 284, and a bias resistor 285. The detection capacitor 281 and the detection resistor 282 operate as a high pass filter to detect a transient overstress event based on a rate of voltage change between the dummy supply node VDDX and the ground pad VSS. When a transient overstress event is detected, the NPN bipolar transistor 283 turns on, and in turn controls the PNP bipolar transistor 284 to activate the detection current $I_{TX}$. The bias resistor 285 aids in biasing the collector of the NPN bipolar transistor 283 and the base of the PNP bipolar transistor 284. In the illustrated embodiment, the detection current $I_{TX}$ is provided to the base of the PNP bipolar transistor 211 to selectively decrease the activation voltage of the SCR 201.

Additional details of the actively-controlled SCR 270 can be similar to those described earlier.

Figure 6G:
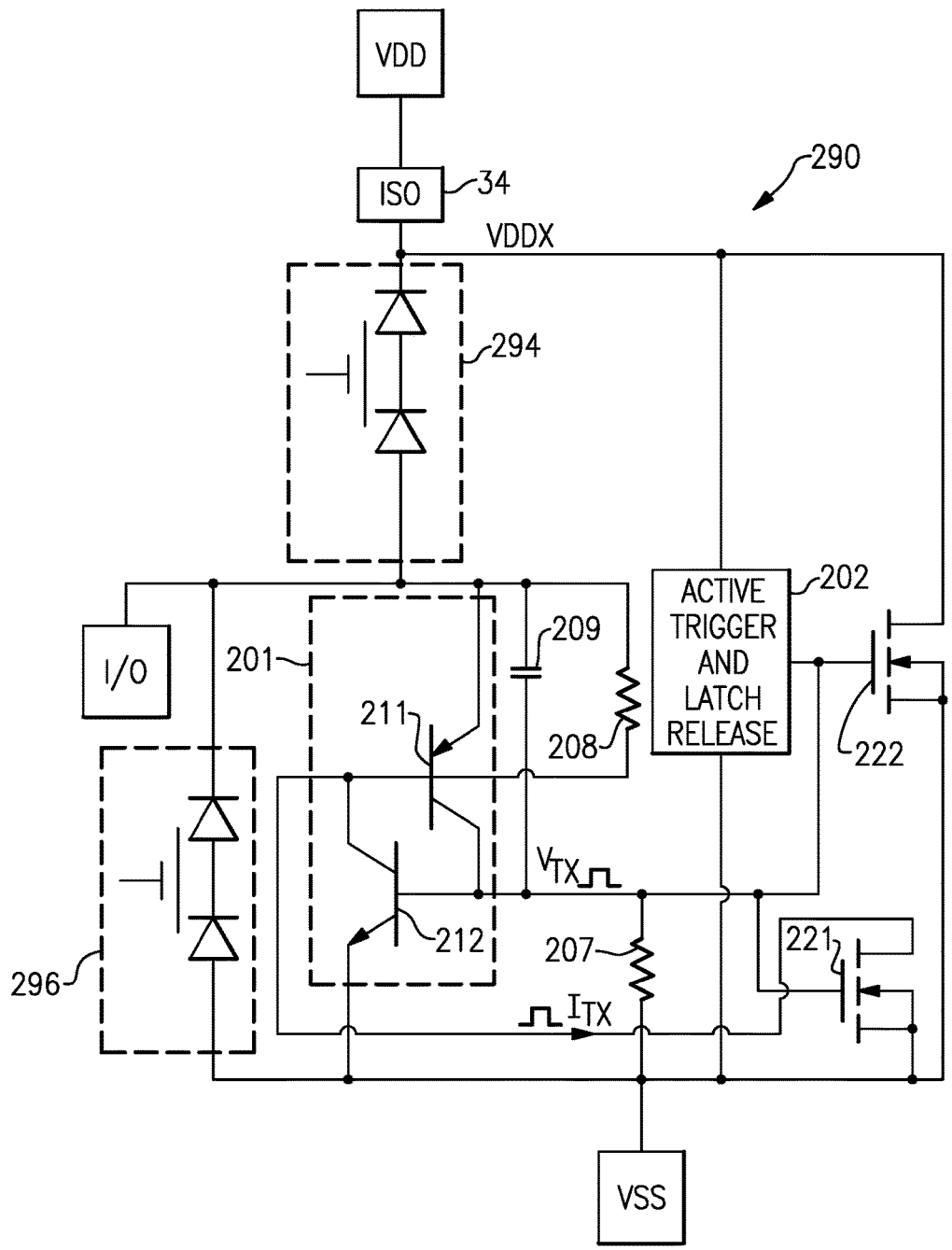
FIG. 6G is a schematic diagram of an actively-controlled SCR according to another embodiment.

FIG. 6G is a schematic diagram of an actively-controlled SCR 290 according to another embodiment. The actively-controlled SCR 290 includes an SCR 201, an active trigger and latch release circuit 202, an isolation circuit 34, a first resistor 207, a second resistor 208, a bond pad capacitor 209, a current source NMOS transistor 221, a clamp NMOS transistor 222, a signal pad I/O, a ground pad VSS, and a power high pad VDD, which can be as described earlier.

The actively-controlled SCR 290 further includes a low capacitance reverse protection diode structure 296, which serves to provide protection against negative polarity transient overstress events that reduce a voltage of the signal pad I/O relative to the ground pad VSS. The actively-controlled SCR 290 further includes a low capacitance overvoltage sense diode structure 294, which serves to control a voltage of the dummy supply node VDDX based on a voltage of the signal pad I/O.

The low capacitance reverse protection diode structure 296 and the low capacitance overvoltage sense diode structure 294 illustrate embodiments of a reverse protection circuit and an overvoltage sense circuit, respectively, which are suitable for applications in which a relatively small amount of capacitive loading is desired for the signal pad I/O. However, a reverse protection circuit and/or overvoltage sense circuit can be implemented in other ways.

In one embodiment, the low capacitance reverse protection diode structure 296 is implemented using two or more junction diodes in series, with a field plate disposed over the junction diodes to expedite diode activation. The junction diodes can be monolithically integrated to reduce area and improve device robustness, or independently connected. The low capacitance overvoltage sense diode structure 294 can be implemented in similar manner.

Additional details of the actively-controlled SCR 290 can be similar to those described earlier.

Figure 6H:
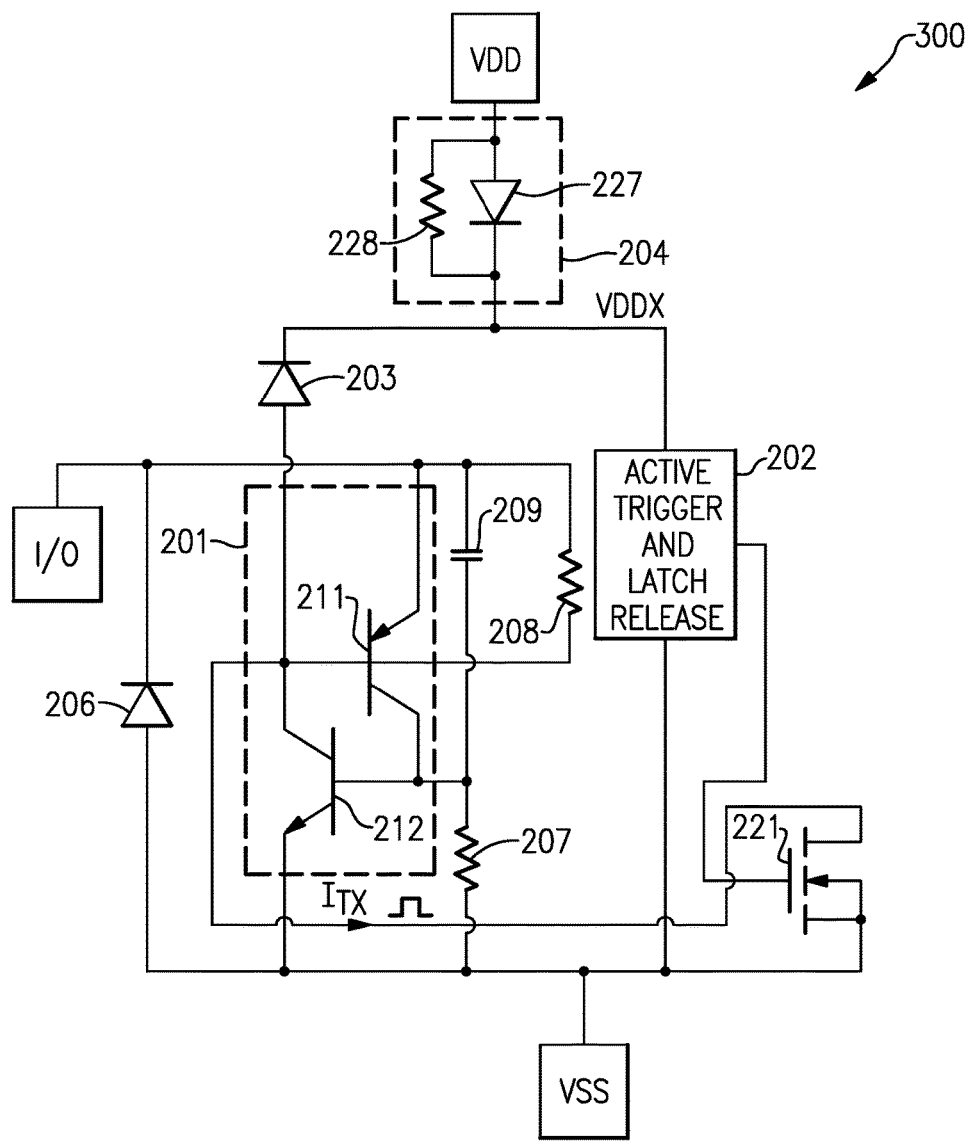
FIG. 6H is a schematic diagram of an actively-controlled SCR according to another embodiment.

FIG. 6H is a schematic diagram of an actively-controlled SCR 300 according to another embodiment. The actively-controlled SCR 300 includes an SCR 201, an active trigger and latch release circuit 202, an overvoltage sense diode 203, an isolation circuit 204, a reverse protection diode 206, a first resistor 207, a second resistor 208, a bond pad capacitor 209, a current source NMOS transistor 221, a signal pad I/O, a ground pad VSS, and a power high pad VDD.

The actively-controlled SCR 300 of FIG. 6H is similar to the actively-controlled SCR 230 of FIG. 6B, except that the actively-controlled SCR 300 of FIG. 6H illustrates a configuration in which the trigger voltage $V_{TX}$ is not provided to the base of the NPN bipolar transistor 212.

Additional details of the actively-controlled SCR 300 can be similar to those described earlier.

Figure 6I:
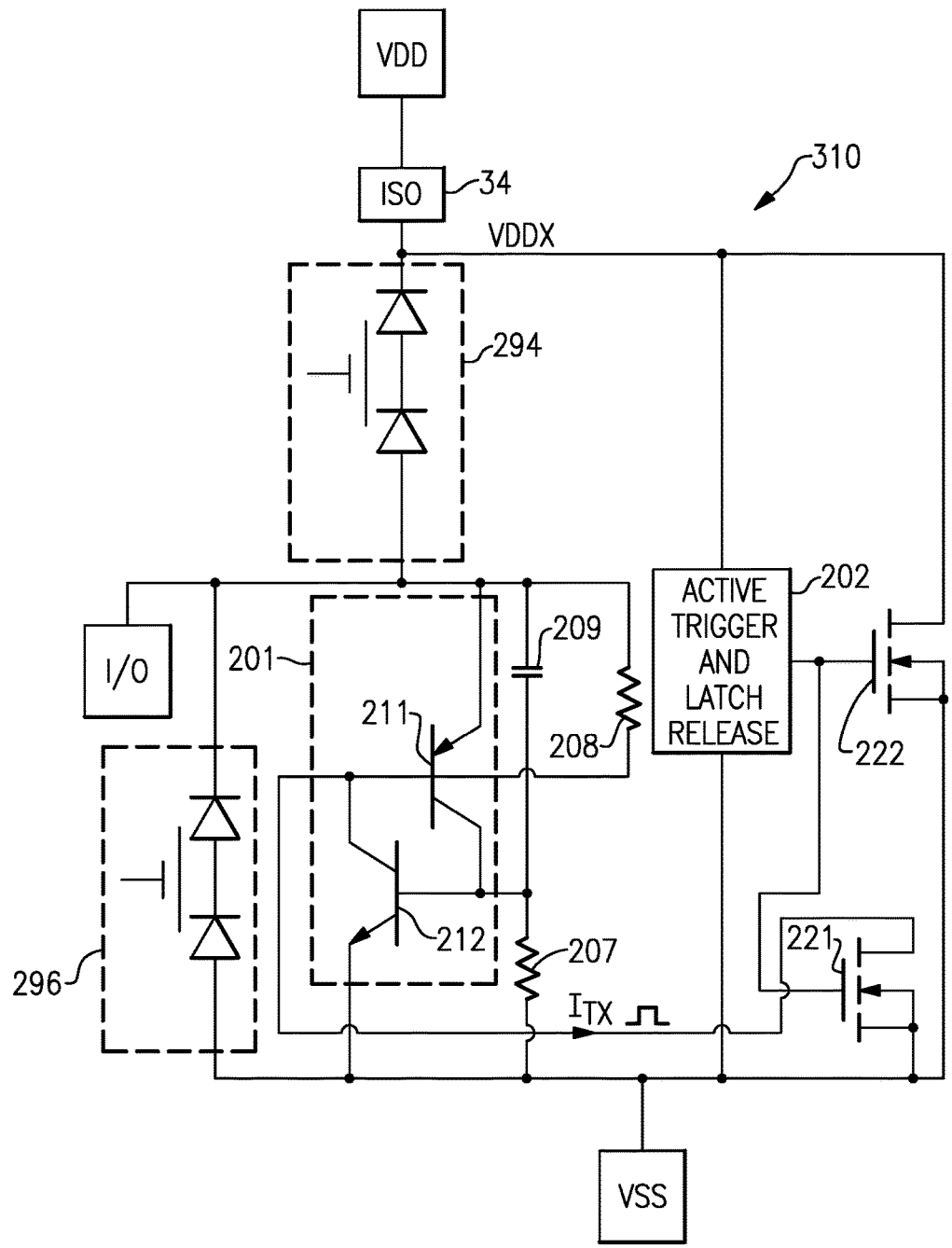
FIG. 6I is a schematic diagram of an actively-controlled SCR according to another embodiment.

FIG. 6I is a schematic diagram of an actively-controlled SCR 310 according to another embodiment. The actively-controlled SCR 310 includes an SCR 201, an active trigger and latch release circuit 202, an isolation circuit 34, a first resistor 207, a second resistor 208, a bond pad capacitor 209, a current source NMOS transistor 221, a clamp NMOS transistor 222, a low capacitance overvoltage sense diode structure 294m a low capacitance reverse protection diode structure 296, a signal pad I/O, a ground pad VSS, and a power high pad VDD.

The actively-controlled SCR 310 of FIG. 6I is similar to the actively-controlled SCR 290 of FIG. 6G, except that the actively-controlled SCR 310 of FIG. 6I illustrates a configuration in which the trigger voltage $V_{TX}$ is not provided to the base of the NPN bipolar transistor 212.

Additional details of the actively-controlled SCR 310 can be similar to those described earlier.

Figure 7A:
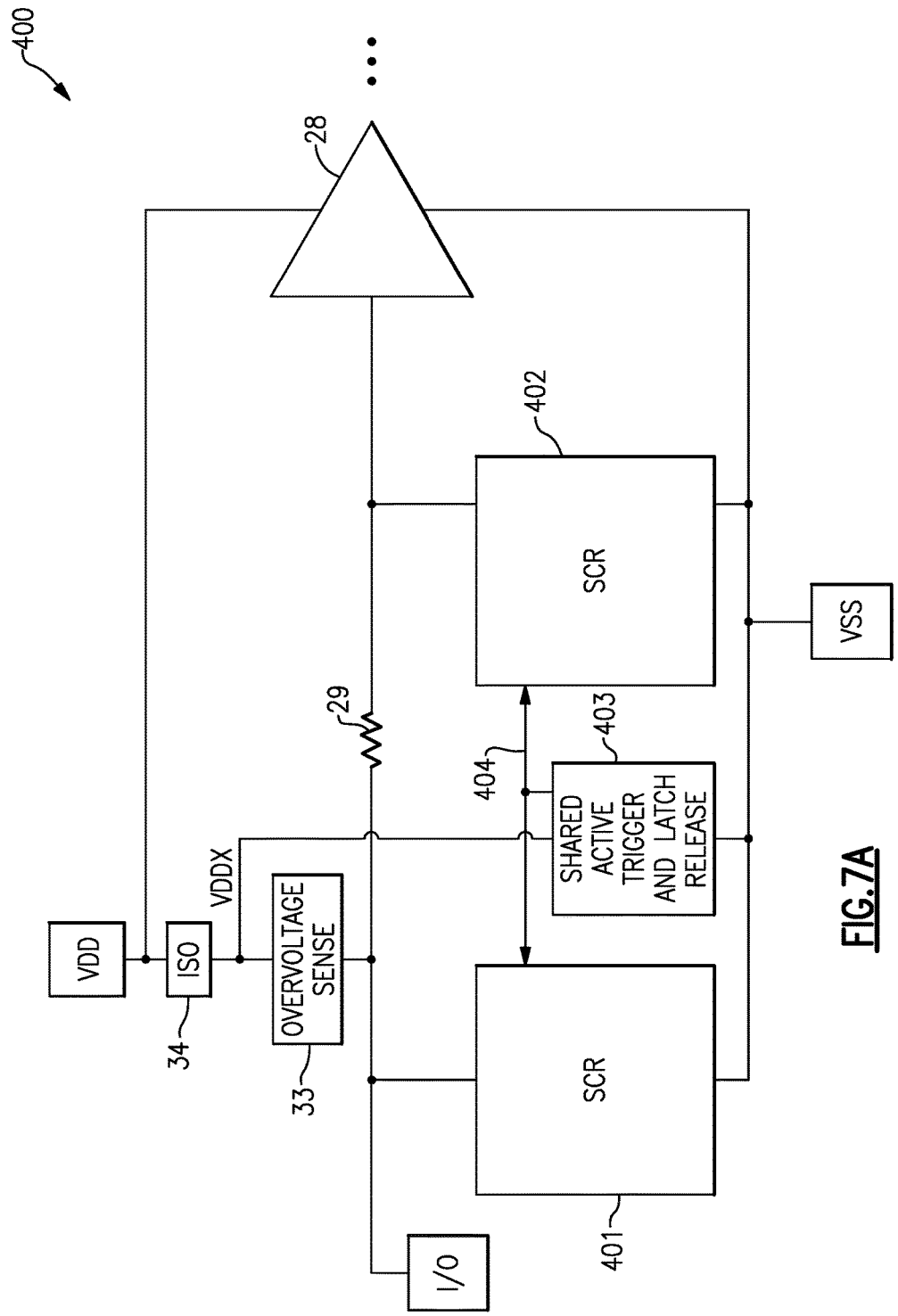
FIG. 7A is a schematic diagram of a transceiver interface according to another embodiment.

FIG. 7A is a schematic diagram of a transceiver interface 400 according to another embodiment. The transceiver interface 400 includes a signal pad I/O, a ground pad VSS, a supply pad VDD, an input receiver 28, an input resistor 29, an overvoltage sense circuit 33, an isolation circuit 34, a first SCR 401, a second SCR 402, and a shared active trigger and latch release circuit 403.

For clarity of the figures, only certain structures of the transceiver interface 400 are shown in FIG. 7A. Thus, the transceiver interface 400 can include additional circuits, devices, and/or other structures.

In the illustrated embodiment, the input resistor 29 is electrically connected between the signal pad I/O and an input to the input receiver 28. Additionally, the input receiver 28 is electrically connected to the ground pad VSS and to the supply pad VDD. The overvoltage sense circuit 33 is electrically connected between the signal pad I/O and a dummy supply node VDDX, and the isolation circuit 34 is electrically connected between the supply pad VDD and the dummy supply node VDDX. As shown in FIG. 7A, the overvoltage sense circuit 33 is electrically connected in shunt with respect to the signal pad I/O. The shared active trigger and latch release circuit 403 is electrically connected between the dummy supply node VDDX and the ground pad VSS, and generates a trigger signal 404 for the first SCR 401 and the second SCR 402. As shown in FIG. 7A, the first SCR 401 is electrically connected between signal pad I/O and the ground pad VSS, and the second SCR 402 is electrically connected between the input to the input receiver 28 and the ground pad VSS.

The illustrated embodiment uses the shared active trigger and latch release circuit 403 to actively control multiple SCRs. Implementing a protection scheme in this manner can reduce layout area and/or centralize active control.

As shown in FIG. 7A, the input resistor 29 is electrically connected between the first and second SCRs 401, 402. In certain implementations, the first SCR 401 has a larger overstress handling capability relative to the second SCR 402. In such configurations, the first SCR 401 can serve as a primary overstress protection device, and the second SCR 402 can serve as a secondary overstress protection device. For example, although the input resistor 29 can reduce the amount of charge that reaches the input receiver 28, a portion of charge from an overstress event can nevertheless reach the input of the input receiver 28 via the input resistor 29. Thus, the second SCR 402 further enhances overall overstress protection by shunting charge that reaches the input receiver 28 to the ground pad VSS.

Although FIG. 7A illustrates protection scheme with multiple SCRs and a shared active trigger and latch release circuit in the context of protecting an input receiver of a transceiver interface, such a protection scheme is applicable to a wide variety of applications. In another embodiment, the first and second SCRs 401, 402 and the shared active trigger and latch release circuit 403 protects a signal node associated with an output transmitter of a transceiver interface.

Additional details of the transceiver interface 400 can be as described earlier.

Figure 7B:
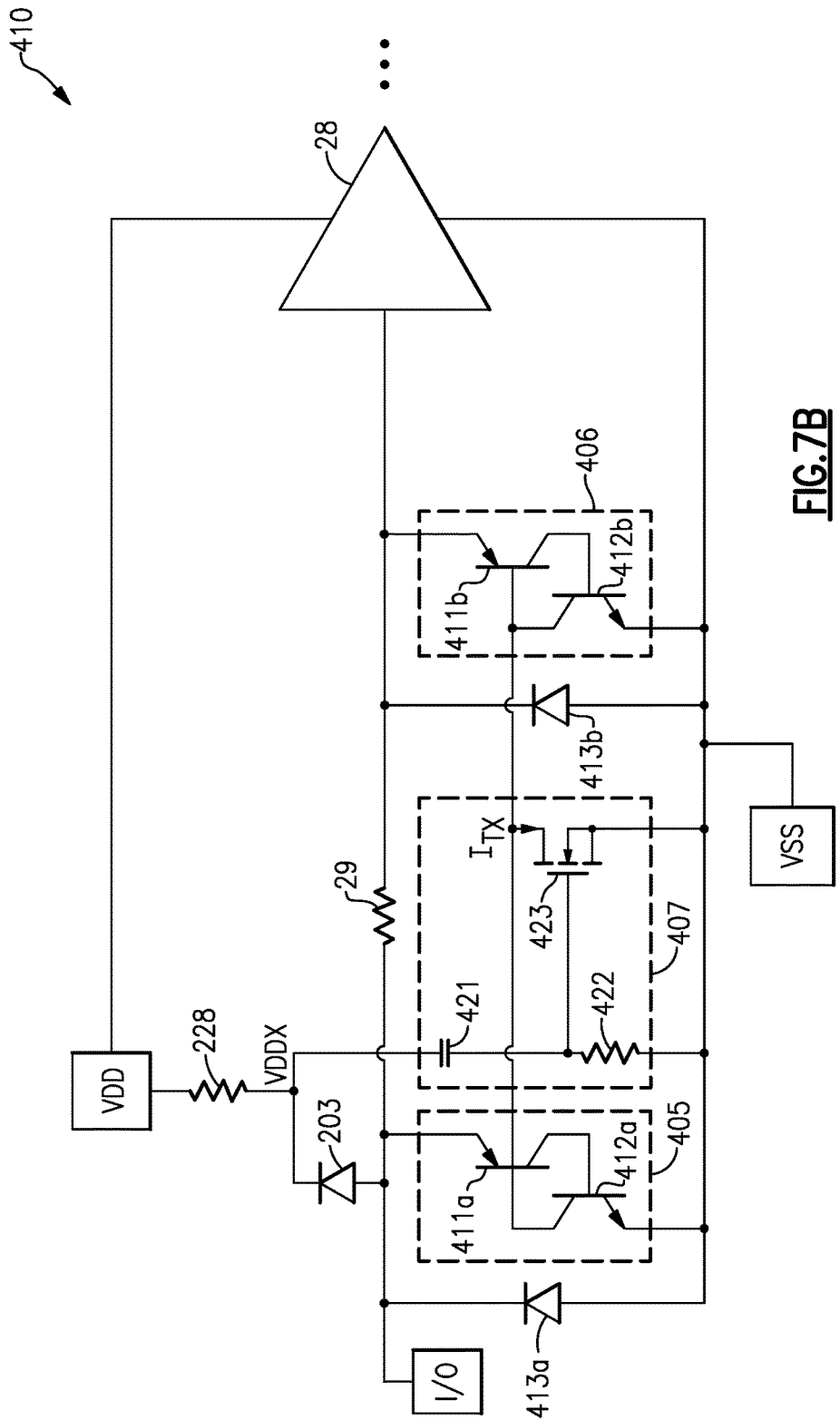
FIG. 7B is a schematic diagram of a transceiver interface according to another embodiment.

FIG. 7B is a schematic diagram of a transceiver interface 410 according to another embodiment. The transceiver interface 410 includes a signal pad I/O, a ground pad VSS, a supply pad VDD, an input receiver 28, an input resistor 29, an overvoltage sense diode 203, and an isolation resistor 228, which can be as described earlier. The transceiver interface 410 further includes a first SCR 405, a second SCR 406, a shared active trigger and latch release circuit 407, a first reverse protection diode 413a, and a second reverse protection diode 413b. The first SCR 405 includes a first PNP bipolar transistor 411a and a first NPN bipolar transistor 412a, which are cross-coupled with one another. Additionally, the second SCR 406 includes a second PNP bipolar transistor 411b and a second NPN bipolar transistor 412b, which are cross-coupled with one another.

The transceiver interface 410 of FIG. 7B illustrated one embodiment of the transceiver interface 400 of FIG. 7A. However, the transceiver interface 400 of FIG. 7A can be implemented in other ways, including, but not limited to, configurations with a different implementation of a reverse protection circuit, an isolation circuit, an overvoltage sense circuit, and/or a shared active trigger and latch release circuit.

In the illustrated embodiment, the shared active trigger and latch release circuit 407 includes a detection capacitor 421, a detection resistor 422, and an NMOS transistor 423. The detection capacitor 421 and the detection resistor 422 operate to filter low signal frequencies to detect a transient overstress event based on a rate of voltage change between the dummy supply node VDDX and the ground pad VSS. When a transient overstress event having a sufficiently high rate of voltage change is detected, the NMOS transistor 423 turns on and activates the detection current $I_{TX}$. In the illustrated embodiment, a first portion of the detection current $I_{TX}$ is provided to the base of the first PNP bipolar transistor 411a and a second portion of the detection current $I_{TX}$ is provided to the base of the second PNP bipolar transistor 411b. However, other implementations are possible.

Additional details of the transceiver interface 410 can be as described earlier.

Figure 8:
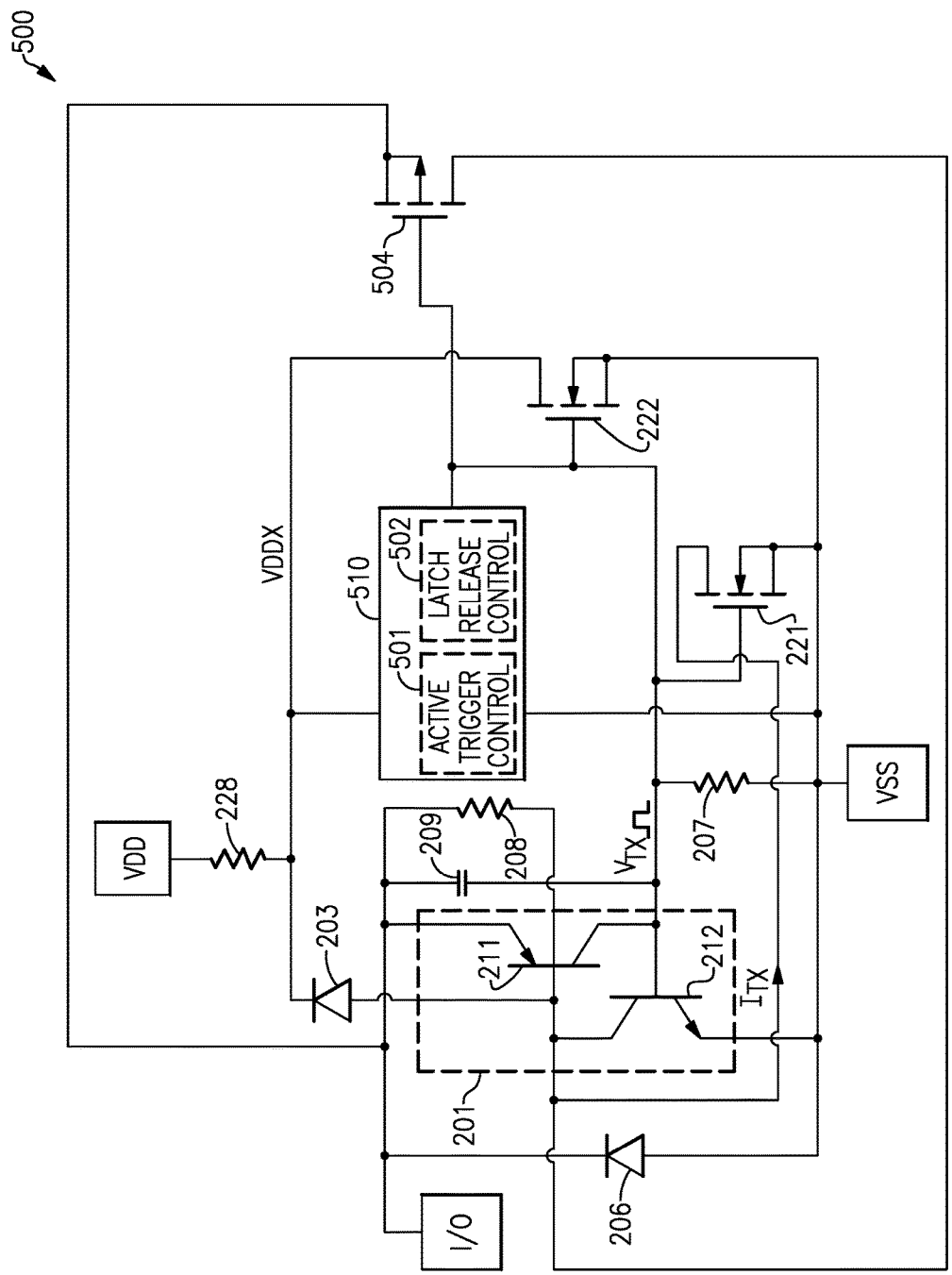
FIG. 8 is a schematic diagram of an actively-controlled SCR according to another embodiment.

FIG. 8 is a schematic diagram of an actively-controlled SCR 500 according to another embodiment. The actively-controlled SCR 500 includes an SCR 201, an overvoltage sense diode 203, an isolation resistor 228, a reverse protection diode 206, a first resistor 207, a second resistor 208, a bond pad capacitor 209, a current source NMOS transistor 221, a clamp NMOS transistor 222, a signal pad I/O, a ground pad VSS, and a power high pad VDD, which can be as described earlier.

The actively-controlled SCR 500 further includes an active trigger and latch release circuit 510, which includes an active trigger control circuit 501 and a latch release circuit 502. The active trigger and latch release circuit 510 of FIG. 8 illustrates one embodiment of an active trigger and latch release circuit that includes separate sub-circuits for controlling latch or trigger of an SCR and for controlling latch release of the SCR. By implementing an active trigger and latch release circuit in this manner, enhanced control (including, for example, separately optimized control) over trigger and latch release can be provided.

As shown in FIG. 8, the actively-controlled SCR 500 further includes a pull-up p-type metal oxide semiconductor (PMOS) transistor 504, which includes a gate controlled by the trigger voltage $V_{TX}$, a source electrically connected to the signal pad I/O, and a drain electrically connected to the base of the PNP bipolar transistor 211. Including the pull-up PMOS transistor 504 helps to increase or pull up the base voltage of the PNP bipolar transistor 211 during a transient overstress event, thereby enhancing the turn-on speed of the SCR 201 and reducing voltage overshoot at the signal pad I/O. Although the illustrated pull-up transistor is implemented using a PMOS transistor, a pull-up transistor can be implemented in other ways, including, for example, using other transistor types.

Additional details of the actively-controlled SCR 500 can be as described earlier.

Figure 9:
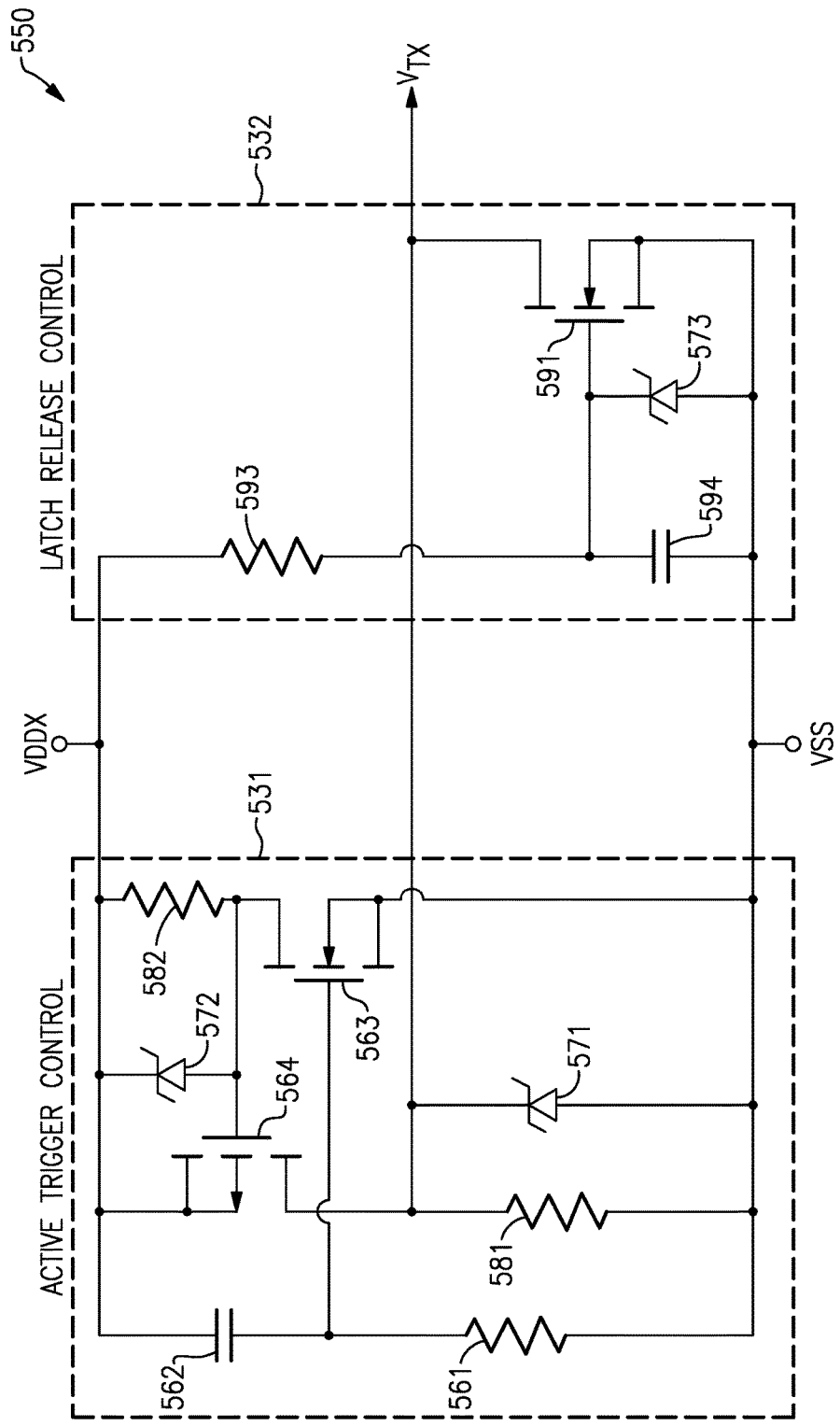
FIG. 9 is a schematic diagram of an active trigger and latch release circuit according to one embodiment.

FIG. 9 is a schematic diagram of an active trigger and latch release circuit 550 according to one embodiment. The active trigger and latch release circuit 550 includes an active trigger control circuit 531 and a latch release control circuit 532. Although the active trigger and latch release circuit 550 illustrates one embodiment of an active trigger and latch release circuit that includes separate sub-circuits for controlling trigger of an SCR and for controlling latch release of the SCR, other implementations are possible.

The illustrated active trigger control circuit 531 includes a trigger detection resistor 561, a trigger detection capacitor 562, a trigger NMOS transistor 563, a trigger PMOS transistor 564, a first bias resistor 581, a second bias resistor 582, a first gate protection Zener diode 571, and a second gate protection Zener diode 572. The trigger detection capacitor 562 and the trigger detection resistor 561 are electrically connected in series between the dummy supply node VDDX and the ground node VSS, and operate as a high pass filter to detect a transient overstress event. When a transient overstress event is detected, the trigger NMOS transistor 563 is turned on, which in turn turns on the trigger PMOS transistor 564 to activate the trigger voltage $V_{TX}$.

As shown in FIG. 9, the illustrated latch release control circuit 532 includes a release detection resistor 593, a release detection capacitor 594, a release NMOS transistor 591, and a third gate protection Zener diode 573. The release detection resistor 593 and the release detection capacitor 594 are electrically connected in series between the dummy supply node VDDX and the ground node VSS, and operate as a low pass filter to detect when a transient overstress event has passed. When passage of the transient overstress event is detected, the release NMOS transistor 591 turns on and deactivates the trigger voltage $V_{TX}$.

The Zener diodes 571-573 serve to limit overvoltage conditions, thereby protecting sensitive circuitry of the actively-controlled SCR, such as MOS transistor gates.

Additional details of the active trigger and latch release circuit 550 can be as described earlier.

Figure 10A:
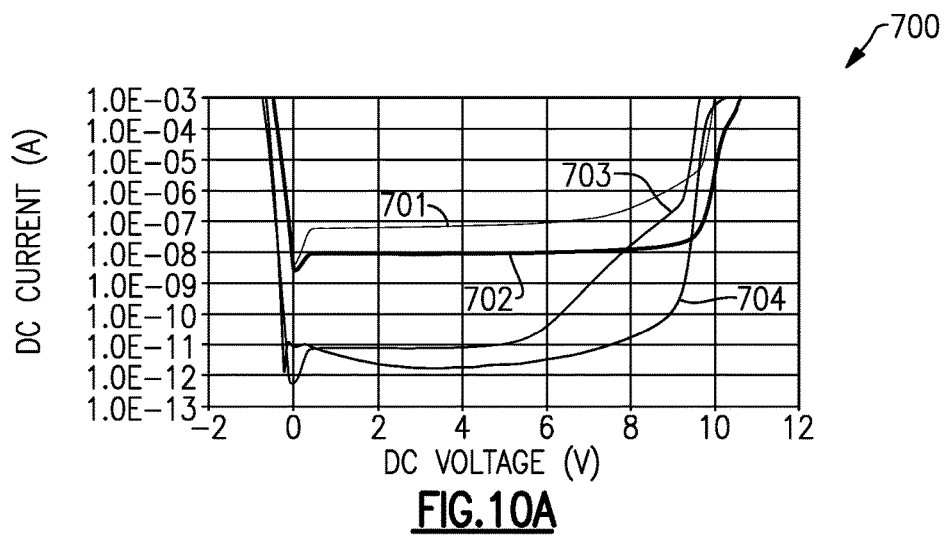
FIG. 10A is a graph of DC current versus DC voltage for an actively-controlled SCR according to one embodiment.

FIG. 10A is a graph 700 of DC current versus DC voltage for an actively-controlled SCR according to one embodiment. The graph 700 includes a first simulated plot 701 of DC current versus DC voltage at 125° C. for an actively-controlled SCR in which a trigger signal is activated. The graph 700 further includes a second simulated plot 702 of DC current versus DC voltage at 125° C. for the actively-controlled SCR in which the trigger signal is deactivated or released. As shown by comparison of the first simulated plot 701 to the second simulated plot 702, activation of the trigger signal provides earlier activation of the SCR. The graph 700 includes a third simulated plot 703 of DC current versus DC voltage at 25° C. for an actively-controlled SCR in which a trigger signal is activated. The graph 700 includes a fourth simulated plot 704 of DC current versus DC voltage at 25° C. for an actively-controlled SCR in which a trigger signal is deactivated or released. As shown by comparison of the third simulated plot 703 to the fourth simulated plot 704, activation of the trigger signal provides earlier activation of the SCR.

The graph 700 of FIG. 10A shows simulation results for one implementation of an actively-controlled SCR implemented using the embodiment shown in FIG. 6B. Although the graph 700 illustrates one example of simulation results, other simulation results are possible, including results that depend on implementation, application, and/or processing technology.

Figure 10B:
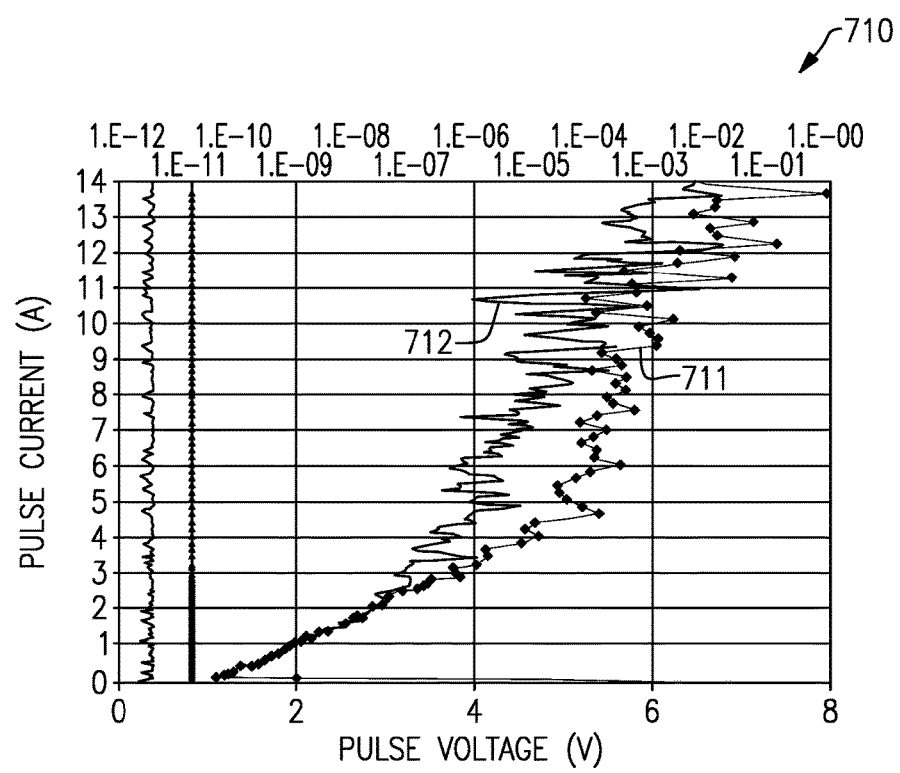
FIG. 10B is a graph of transmission line pulsing (TLP) current versus TLP voltage for an actively-controlled SCR according to one embodiment.

FIG. 10B is a graph 710 of transmission line pulsing (TLP) current versus TLP voltage for an actively-controlled SCR according to one embodiment. The graph 710 includes a first TLP plot 711 for an actively-controlled SCR in which a trigger signal is activated and a second TLP plot 712 for the actively-controlled SCR in which the trigger signal is released. As shown by comparison of the first TLP plot 701 and the second TLP plot 702, the activation voltage of the SCR with the trigger signal activated is about 2 V, while the activation voltage of the SCR with the trigger signal released is about 7 V. Thus, activation of the trigger signal selectively decreases the SCR's activation voltage.

Figure 11A:
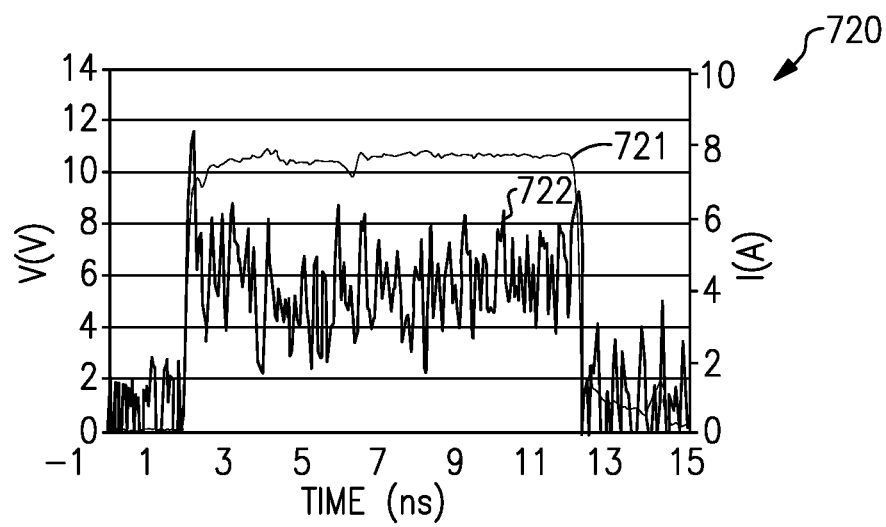
FIG. 11A is a graph of one example of voltage and current versus time for an actively-controlled SCR according to one embodiment.

FIG. 11A is a graph 720 of one example of voltage and current versus time for an actively-controlled SCR according to one embodiment. The graph 720 includes a first plot 721 of current versus time and a second plot 722 of voltage versus time for a simulation in which an ESD event occurs at about 2 ns. As shown in FIG. 11A, the voltage overshoot is about 11.5 V.

Figure 11B:
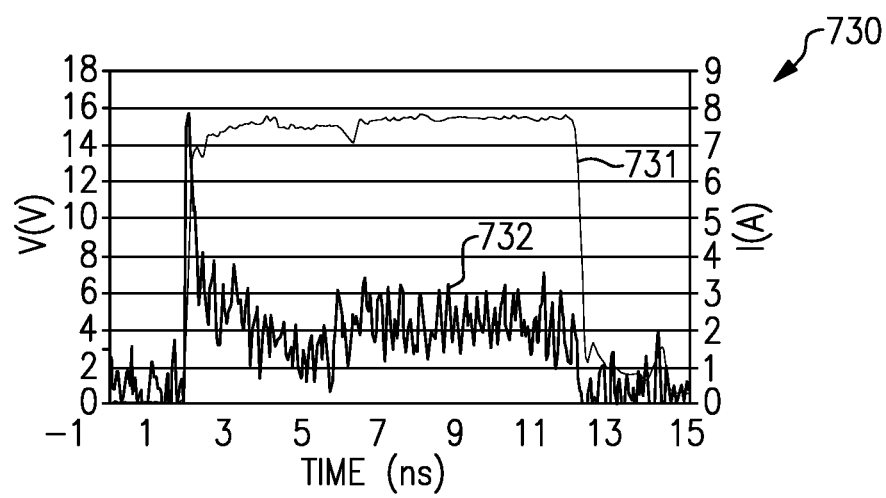
FIG. 11B is a graph of one example of voltage and current versus time for an SCR without active control.

FIG. 11B is a graph 720 of one example of voltage and current versus time for an actively-controlled SCR according to one embodiment. The graph 720 includes a first plot 721 of current versus time and a second plot 722 of voltage versus time for a simulation in which an ESD event occurs at about 2 ns. As shown in FIG. 11A, the voltage overshoot is about 11.5 V.

FIG. 11B is a graph of one example of voltage and current versus time for an SCR without active control. The graph 720 includes a first plot 731 of current versus time and a second plot 732 of voltage versus time for a simulation in which an ESD event occurs at about 2 ns. As shown in FIG. 11B, the voltage overshoot is about 16 V.

As shown by a comparison of the graph 720 of FIG. 11A and the graph 730 of FIG. 11B, voltage overshoot is reduced by actively controlling the SCR. For example, the current versus time plot 721 of FIG. 11A is similar to the current versus time plot 731 of FIG. 11B, but the voltage versus time plot 722 of FIG. 11A exhibits reduced voltage overshoot relative to the voltage versus time plot 732 of FIG. 11B.

APPLICATIONS

Devices employing the above described schemes can be implemented into various electronic devices. Examples of the electronic devices can include, but are not limited to, consumer electronic products, parts of the consumer electronic products, electronic test equipment, communication infrastructure applications, etc. Further, the electronic device can include unfinished products, including those for communication, industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An integrated circuit comprising:
a silicon controlled rectifier (SCR) electrically connected between a signal node and a discharge node, wherein the SCR is configured to receive one or more trigger signals that are operable to control an activation voltage of the SCR;
an overvoltage sense circuit configured to control a voltage of a dummy supply node based on a voltage of the signal node; and
an active trigger and latch release circuit configured to detect presence of a transient overstress event at the signal node based on the voltage of the dummy supply node and to control activation and latch release of the SCR, wherein the active trigger and latch release circuit is further configured to activate the one or more trigger signals in response to detecting presence of the transient overstress event.

2. The integrated circuit of claim 1, further comprising a supply node and an isolation circuit electrically connected between the supply node and the dummy supply node.

3. The integrated circuit of claim 2, wherein the supply node is electrically connected to a power high pad, the discharge node is electrically connected to a ground pad, and the signal node is electrically connected to a signal pad.

4. The integrated circuit of claim 2, wherein the isolation circuit comprises a resistor electrically connected between the supply node and the dummy supply node.

5. The integrated circuit of claim 2, wherein the isolation circuit comprises a diode including an anode electrically connected to the supply node and a cathode electrically connected to the dummy supply node.

6. The integrated circuit of claim 2, wherein a voltage of the supply node is controlled by a power high supply voltage, and wherein a voltage of the discharge node is controlled by a ground voltage.

7. The integrated circuit of claim 1, wherein the SCR comprising an NPN bipolar transistor and a PNP bipolar transistor, wherein the NPN bipolar transistor and the PNP bipolar transistor are cross-coupled.

8. The integrated circuit of claim 7, wherein the one or more trigger signals comprises a trigger voltage provided to a base of the NPN bipolar transistor.

9. The integrated circuit of claim 8, further comprising a clamp transistor electrically connected between the dummy supply node and the discharge node, wherein turn on of the clamp transistor is controlled by the trigger voltage.

10. The integrated circuit of claim 8, further comprising a pull-up transistor electrically connected between the signal node and a base of the PNP bipolar transistor, wherein turn on of the pull-up transistor is controlled by the trigger voltage.

11. The integrated circuit of claim 7, wherein the one or more trigger signals comprises a trigger current provided to a base of the PNP bipolar transistor.

12. The integrated circuit of claim 7, further comprising a bond pad capacitor electrically connected between the signal node and a base of the NPN bipolar transistor.

13. The integrated circuit of claim 7, wherein the overvoltage sense circuit comprises a diode including an anode electrically connected to a base of the PNP bipolar transistor and a cathode electrically connected to the dummy supply node.

14. The integrated circuit of claim 1, wherein the overvoltage sense circuit comprises a diode including an anode electrically connected to the signal node and a cathode electrically connected to the dummy supply node.

15. The integrated circuit of claim 1, wherein the active trigger and latch release circuit comprises an active trigger control circuit configured to control activation of the one or more trigger signals in response to detecting presence of the transient overstress event, and a latch release control circuit configured to control deactivation of the one or more trigger signals in response to detecting passage of the transient overstress event.

16. The integrated circuit of claim 15, wherein the active trigger control circuit comprises a high pass filter comprising a first capacitor and a first resistor electrically connected in series between the dummy supply node and the discharge node, wherein the latch release control circuit comprises a low pass filter comprising a second resistor and a second capacitor electrically connected in series between the dummy supply node and the discharge node.

17. A method for protecting an integrated circuit from electrical overstress, the method comprising:
controlling a voltage of a dummy supply node based on a voltage of a signal node using an overvoltage sense circuit;

detecting a presence of a transient overstress event at the signal node based on the voltage of the dummy supply node using an active trigger and latch release circuit;

activating one or more trigger signals in response to detecting the presence of the transient overstress event using the active trigger and latch release circuit; and controlling an activation voltage of a silicon controlled rectifier (SCR) that is electrically connected between the signal node and a discharge node based on the one or more trigger signals.

18. A packaged system comprising:

a lead;

a first system on a chip (SOC) electrically connected to the lead, wherein the first SOC comprises:

a silicon controlled rectifier (SCR) electrically connected between a signal node and a discharge node, wherein the SCR is configured to receive one or more trigger signals that are operable to control an activation voltage of the SCR;

an overvoltage sense circuit configured to control a voltage of a dummy supply node based on a voltage of the signal node; and an active trigger and latch release circuit configured to detect presence of a transient overstress event at the signal node based on a voltage difference between the dummy supply node and the discharge node, wherein the active trigger and latch release circuit is further configured to activate the one or more trigger signals in response to detecting presence of the transient overstress event.

19. The packaged system of claim 18, further comprising a supply node and an isolation circuit electrically connected between the supply node and the dummy supply node.

20. The packaged system of claim 18, further comprising a second SOC electrically connected to the first SOC, wherein the SCR provides overstress protection to at least one pad of the second SOC.

* * * * *